United States Patent
Ellenbogen et al.

(10) Patent No.: US 6,348,700 B1
(45) Date of Patent: Feb. 19, 2002

(54) MONOMOLECULAR RECTIFYING WIRE AND LOGIC BASED THEREUPON

(75) Inventors: James C. Ellenbogen, McLean; John Christopher Love, Springfield, both of VA (US)

(73) Assignee: The Mitre Corporation, McLean, VA (US)

(*) Notice: Subject to any disclaimer, the term of this patent is extended or adjusted under 35 U.S.C. 154(b) by 0 days.

(21) Appl. No.: 09/178,747

(22) Filed: Oct. 27, 1998

(51) Int. Cl.[7] .......................... H01C 35/24; H01L 51/00
(52) U.S. Cl. ............................... 257/40; 259/9; 259/14
(58) Field of Search ............................. 257/40, 9, 14

(56) References Cited

U.S. PATENT DOCUMENTS

| | | |
|---|---|---|
| 3,953,874 A | 4/1976 | Aviram et al. |
| 4,360,703 A | 11/1982 | Bolton et al. |
| 4,427,840 A | 1/1984 | Waldrop et al. |
| 4,574,161 A | 3/1986 | Marks |
| 4,613,541 A | 9/1986 | Isoda |
| 4,621,122 A * | 11/1986 | Guilbert et al. |
| 4,803,115 A * | 2/1989 | Fushiki et al. |
| 4,804,930 A | 2/1989 | Simic-Glavaski |
| 4,839,112 A | 6/1989 | Wynne et al. |
| 4,895,705 A | 1/1990 | Wrighton et al. |
| 4,913,744 A * | 4/1990 | Hoegl et al. |
| 4,933,285 A | 6/1990 | Patton |
| 4,945,257 A | 7/1990 | Marrocco, III |
| 5,016,063 A | 5/1991 | Beratan et al. |
| 5,057,878 A | 10/1991 | Geddes et al. |
| 5,063,417 A | 11/1991 | Hopefield |
| 5,152,805 A | 10/1992 | Geddes et al. |
| 5,179,467 A | 1/1993 | Buchwalter et al. |
| 5,229,624 A | 7/1993 | Marks |
| 5,423,956 A | 6/1995 | White et al. |
| 5,589,692 A | 12/1996 | Reed |
| 5,707,845 A | 1/1998 | Ueyama et al. |
| 5,763,933 A | 6/1998 | White |
| 5,787,032 A | 7/1998 | Heller et al. |

FOREIGN PATENT DOCUMENTS

| | | |
|---|---|---|
| JP | 58-114465 | 7/1983 |
| JP | 60-130857 | 7/1985 |
| JP | 01-112768 | 5/1989 |
| JP | 09-307157 | 11/1997 |
| JP | 10-56117 | 2/1998 |
| WO | WO85/01617 | 4/1985 |
| WO | WO93/25003 | 12/1993 |

OTHER PUBLICATIONS

M. A. Ratner and J. Jortner, "Molecular Electronics: Some Directions," in J. Jortner and M. Ratner (eds.), *Molecular Electronics*, Blackwell Science Ltd., London, UK, 1997, pp. 5–72.

J. M. Tour, R. Wu, J. S. Schumm, "Approaches to Orthogonally Fused Conducting Polymers for Molecular Electronics," *J. Am. Chem. Soc.*, vol. 112, 1990, pp. 5662–5663.

J. M. Tour, R. Wu, J. S. Schumm, "Extended Orthogonally Fused Conducting Oligomers for Molecular Electronic Devices," *J. Am. Chem. Soc.*, vol. 113, 1991, pp. 7064–7066.

J. S. Schumm, D. L. Pearson, and J. M. Tour, "Iterative Divergent/Convergent Approach to Linear Conjugated Oligomers by Successive Doubling of the Molecular Length: A Rapid Route to a 128 Å–Long Potential Molecular Wire," *Angew. Chem. Int. Ed. Engl.*, vol. 33, 1994, pp. 1360–1363.

L. Jones II, D. L. Pearson, J. S. Schumm, and J. M. Tour, "Synthesis of Well–Defined Conjugated Oligomers for Molecular Electronics," *Pure Appl. Chem.*, vol. 68, 1996, pp. 145–148.

R. Wu, J. S. Schumm, D. L. Pearson, and J. M. Tour, "Convergent Synthetic Routes to Orthogonally Fused Conjugated Oligomers Directed Toward Molecular–Scale Device Applications," *J. Organic Chem.*, vol. 61, 1996, pp. 6906–6921.

J. M. Tour, "Conjugated Macromolecules of Precise Length and Constitution. Organic Synthesis of for the Construction of Nanoarchitectures," *Chem. Rev.*, vol. 96, 1996, pp. 537–553.

L. A. Bumm et al., "Are Single Molecular Wires Conducting?," *Science*, vol. 271, Mar. 22, 1996, pp. 1705–1707.

D. L. Pearson and J. M. Tour, "Rapid Syntheses of Oligo(1, 4–thiophene–ethynylene)s with Thioester Termini: Potential Molecular–Scale wires and Alligator Clips," J. Organic Chem, vol. 62, 1997, pp. 1376–1387.

L. Jones II, J. S. Schumm, and J. M. Tour, "Rapid Solution and Solid–Phase Syntheses of Oligo(1,4–phenylene–ethynylene)s with Thioester Termini: Molecular–Scale wires and Alligator Chips," J. Organic Chem, vol. 62, 1997, pp. 1388–1410.

M. A. Reed et al., "Conductance of a Molecular Junction," Science, vol. 278, Oct. 10, 1997, pp. 252–254.

M. Dorogi et al., "Room–temperature Coulomb blockade from a self–assembled molecular nanostructure," Phys. Rev. B, vol. 52, Sep. 15, 1995, pp. 9071–9077.

R. P. Andres et al., "'Coulomb Staircase' at Room Temperature in a Self–Assembled Molecular Nanostructure," Science, vol. 272, May 31, 1996, pp. 1323–1325.

M. P. Samanta et al., "Electronic conduction Through Organic Molecules," Phys Rev. B, vol. 53, 1996, pp. R7626–R7630.

S. Datta et al., "Current–Voltage Characteristics of Self–Assembled Monolayers by Scanning–Tunneling Microscopy," Phys. Rev. Lett., vol. 79, Sep. 29, 1997, pp. 2530–2533.

R. T. Morrison and R. N. Boyd, Organic Chemistry, Second Edition, Allyn and Bacon, Boston, 1966. See esp. pp. 359–361.

A. Aviram and M. A. Ratner, "Molecular Rectifiers," Chem. Phys. Lett., vol. 29, 1974, pp. 277–283.

R. M. Metzger et al., "Unimolecular Electrical Rectification in Hexadecylquinolinium Tricyanoquinodimethanide," J. Am. Chem. Soc., vol. 119, No. 43, Oct. 15, 1997, pp. 10455–10466.

C. Zhou et al., "Nanoscale metal/self–assembled monolayer/metal heterostructures," Appl. Phys. Lett., vol. 71, Aug. 4, 1997, pp. 611–613.

C. Zhou et al., "Mesoscopic Phenomena Studied with Mechanically Controllable Break Junctions at Room Temperature," in J. Jortner and M. Ratner (eds.), Molecular Electronics, Blackwell Science Ltd., London, UK, 1997, pp. 191–213.

A. Dhirani et al., "Self–assembled molecular rectifiers," J. Chem. Phys., vol. 106, Mar. 22, 1997, pp. 5249–5253.

B. I. Yakobson and R. E. Smalley, "Fullerene Nanotubes: C(1,000,000) and Beyond", American Scientist, vol. 85, Jul.–Aug. 1997, pp. 324–337. See also references therein. Overview article about buckytubes.

T. W. Ebbesen et al., "Electrical Conductivity of Individual Carbon Nanotubes," Nature, vol. 382, Jul. 4, 1996, pp. 54–56.

H. Dai, E. W. Wong, and C. M. Lieber, "Probing Electrical Transport in Nanomaterials: Conductivity of Individual Carbon Nanotubes," Science, vol. 272, Apr. 26, 1996, pp. 523–526.

S. J. Tans et al., "Individual Single–Wall Carbon Nanotubes as Quantum Wires," Nature, vol. 386, Apr. 3, 1997, pp. 474–477.

J. W. G. Wildöer et al., "Electronic structure of atomically resolved carbon nanotubes," Nature, vol. 391, Jan. 1, 1998, pp. 59–62.

T. W. Odom et al., "Atomic Structure and Electronic Properties of Single–Walled Carbon Nanotubes," Nature, vol. 391, Jan. 1998, pp. 62–64.

P. G. Collins et al., "Nanotube Nanodevice," Science, vol. 278, Oct. 3, 1997, pp. 100–103. Demonstration of electrical rectification in a carbon nanotube.

S. J. Tans, A. R. M. Verschueren, and C. Dekker, "Room temperature transistor based on a single carbon nanotube," Nature, vol. 393, May 7, 1998, pp. 49–51.

* cited by examiner

Primary Examiner—Stephen D. Meier
(74) Attorney, Agent, or Firm—Rosenberg, Klein & Lee

(57) ABSTRACT

A monomolecular rectifying wire is provided that includes a molecular conducting wire that has been modified to embed a rectifying diode integrally therein. The modified conducting wire includes an electron donating section, an electron accepting section, and an insulating group separating the electron donating and accepting sections. Monomolecular logical gates and more complex logic structures that operate by the conduction of electrical currents are constructed by combinations of molecular rectifying wires, molecular conducting wires, and molecular resistive wires to form a single molecule that electrically exhibits a desired Boolean logic function.

34 Claims, 15 Drawing Sheets

FIG.1A
PRIOR ART
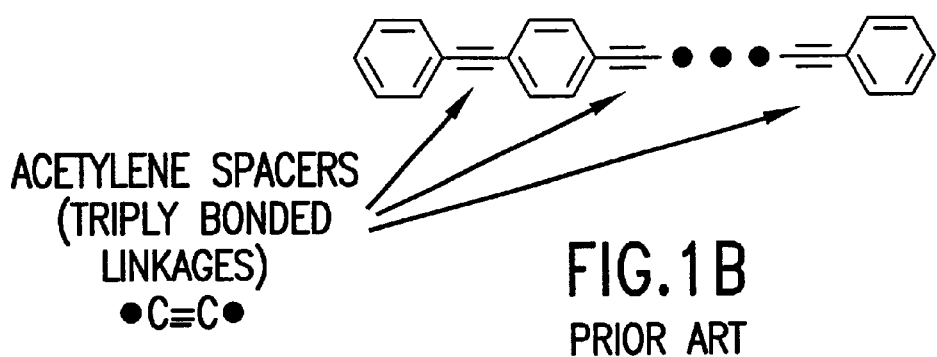
ACETYLENE SPACERS
(TRIPLY BONDED
LINKAGES)
•C≡C•
FIG.1B
PRIOR ART
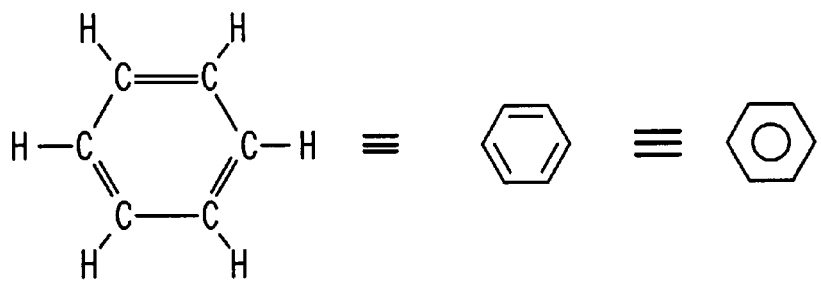
FIG.2
PRIOR ART
   
FIG.3A          FIG.3B
PRIOR ART           PRIOR ART

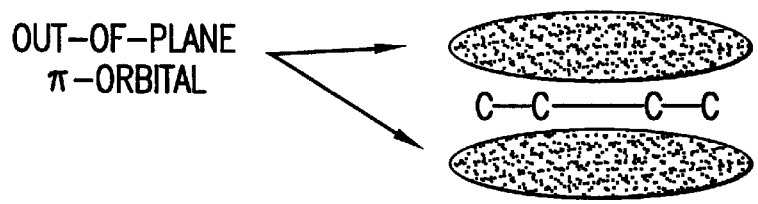
FIG.4
PRIOR ART
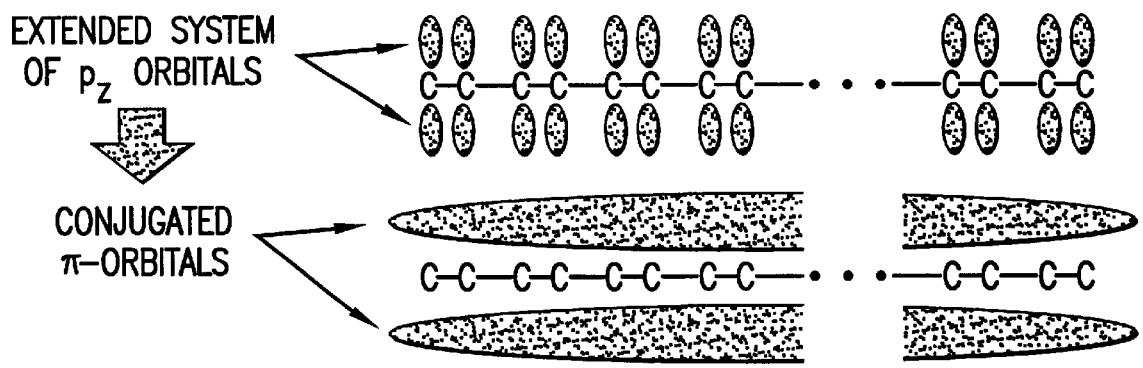
FIG.5
PRIOR ART
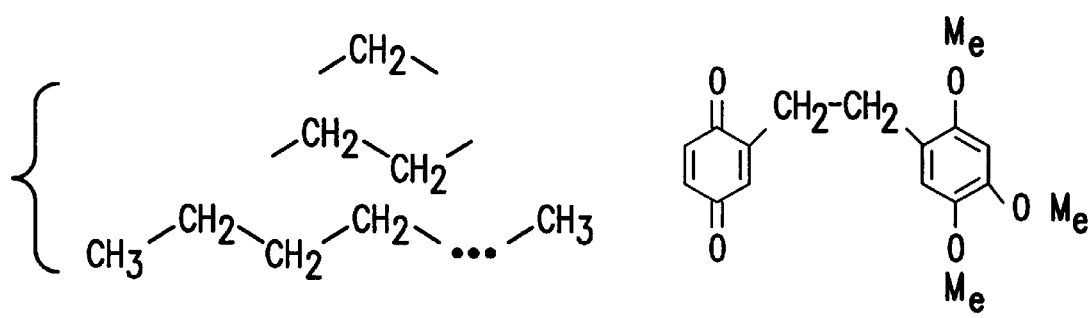
FIG.6
PRIOR ART
FIG.7
PRIOR ART

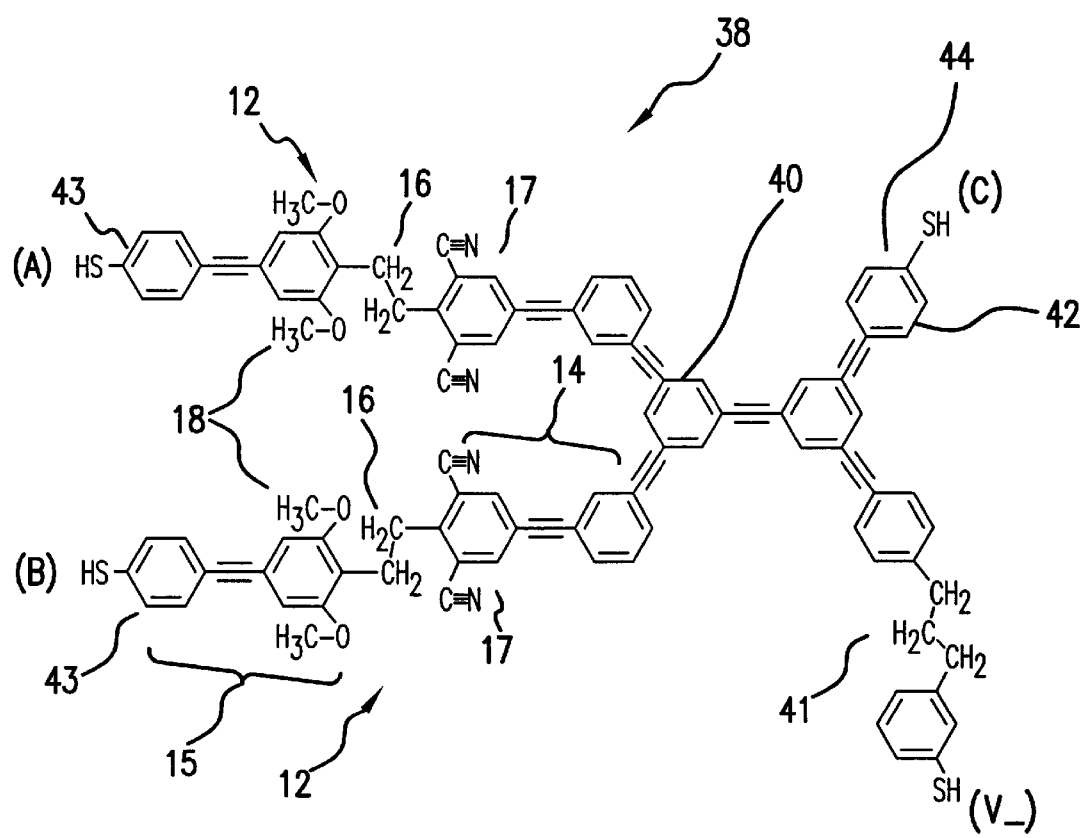
FIG.11A
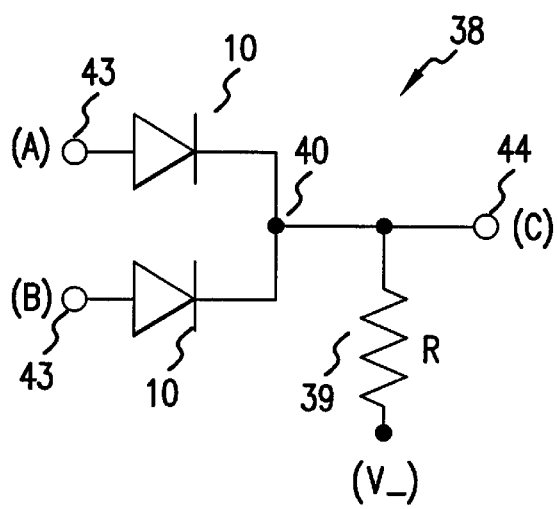
FIG.11B
| A | B | C |
|---|---|---|
| 0 | 0 | 0 |
| 0 | 1 | 1 |
| 1 | 0 | 1 |
| 1 | 1 | 1 |
FIG.11C

| A | B | C |
|---|---|---|
| 0 | 0 | 0 |
| 1 | 0 | 1 |
| 0 | 1 | 1 |
| 1 | 1 | 0 |

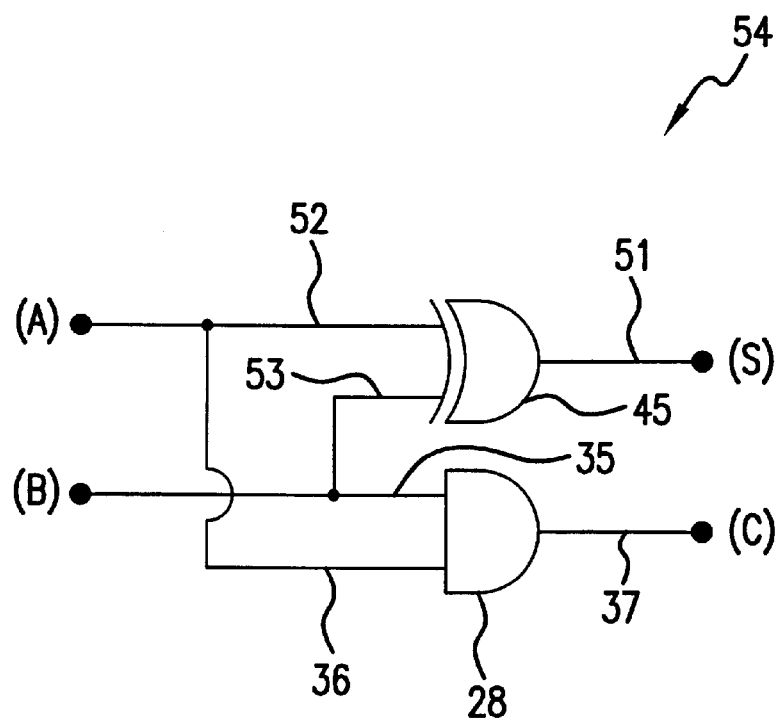

| CARRY IN | B | A | CARRY OUT | SUM |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

MONOMOLECULAR RECTIFYING WIRE AND LOGIC BASED THEREUPON

BACKGROUND OF THE INVENTION

FIELD OF THE INVENTION

The present invention is directed to a monomolecular rectifying diode structure and monomolecular electronic digital logic gates and higher Boolean functions based upon the monomolecular rectifying diode structure. More particularly, the present invention directs itself to a molecular conducting wire having a plurality of primarily aromatic rings that is chemically doped to integrally form a rectifying diode embedded into the molecular conducting wire. The molecular wire consists of a plurality of substantially identical aromatic ring structures bonded or linked together. The wire is chemically doped by bonding at least one electron donating group and/or an electron withdrawing group, to respective discrete portions of the molecular wire, the two portions being separated from each other by an insulating aliphatic or semi-aliphatic bridging group. The present invention also pertains to monomolecular logic gates constructed from combinations of the aforementioned rectifying molecular wire structures. Further, the present invention relates to molecular logic structures which can be formed by combination of the aforementioned logic gates to construct a larger individual molecular structure that performs a higher digital function, as, for instance, a monomolecular electronic HALF ADDER and a monomolecular electronic FULL ADDER.

PRIOR ART

For the past forty years, electronic computers have grown more powerful as their basic sub-unit, the transistor, has shrunk. However, the laws of quantum mechanics and the limitations of fabrication techniques may soon prevent further reduction in the size of today's conventional field effect transistors. Many researchers project that during the next 10–15 years, as the smallest features on mass-produced transistors shrink from their present approximate length range of 100 nanometers to 250 nanometers, the devices will become more difficult and costly to fabricate. In addition, they may no longer function effectively in ultra-densely integrated electronic circuits. In order to continue the miniaturization of circuit elements down to the nanometer scale (nanoelectronic), perhaps even to the molecular scale, researchers are investigating several alternatives to the solid state transistor for ultra-dense circuitry. However, unlike today's FETs, which operate based on the movement of masses of electrons in bulk matter, the new devices take advantage of quantum mechanical phenomena that emerge at the nanometer scale.

There are two broad classes of alternative nanoelectronic switches and amplifiers:

(a) solid state quantum-effect and single electron devices, and (b) molecular electronic devices.

Devices in both classes take advantage of the various quantum effects that begin to dominate electron dynamics on the nanometer scale. Despite the novelty of the designs of solid state quantum-effect and single electron devices, researchers already have been able to develop, fabricate, and employ in circuitry several promising new device types by building upon 50 years of industrial experience with bulk semiconductors. Such solid-state quantum-effect devices change the operating principles for ultra-miniature electronic switches, but they still bear the difficult burden of requiring that nanometer-scale structures be "carved" out of amorphous or crystalline solids.

Molecular electronics is a relatively new approach that would change both the operating principles and the materials used in electronic devices. The incentive for such radical change is that molecules are naturally occurring nanometer-scale structures. Unlike nanostructures built from bulk solids, molecules can be made identically, cheaply, and easily that will be needed for industrial scale production of ultra-dense computers. Two of the significant challenges are to devise molecular structures that act as electrical switches, and to combine these molecules into a more complex circuit structure needed for computation of applications.

Presently, there are two primary types of small molecules that have been proposed and/or demonstrated for use as molecular scale electrical conductors. These two types of molecular-scale conductors are: (a) polyphenylene-based conductors, and (b) carbon nanotubes.

Polyphenylene-Based Conductors

Polyphenylene-based molecular wires involve chains of organic aromatic benzene rings bonded to each other, shown in FIG. 1A or linked to each other by acetylene spacers, as shown in FIG. 1B. Until recently, whether such small molecules had appreciable conductance was an open question. However, over the last two or three years, molecules of this type have been shown by several research groups to conduct small electrical currents.

An individual benzene ring, shown in FIG. 2, has the chemical formula $C_6H_6$. When a benzene ring is drawn, as shown in FIG. 3A, with one of the hydrogen atoms removed (e.g., to form $C_6H_5$), so that it can be bonded as a group to other molecular components, such a ring-like substituent group is termed a phenyl group. When two hydrogen atoms are removed from a benzene ring (e.g., $C_6H_4$), a phenylene ring is obtained, as shown in FIG. 3B. By binding phenylenes to each other on both sides of the respective rings and terminating the resulting chain-like structures with phenyl groups, a polyphenylene-based molecule is thus formed. Thus, molecules made primarily from two or more phenyl groups are known as polyphenylenes.

While polyphenylene chains do not carry as much current as carbon nanotubes, they are very conductive small molecules. Also, polyphenylenes have the great advantage of a very well-defined chemistry and great synthetic flexibility, based upon more than a century of experience accumulated by organic chemists in manipulating such aromatic compounds. Recently, James M. Tour has refined the synthetic techniques for conductive polyphenylene chains (or molecular wires) by developing precise synthetic methods that produce enormous numbers of these molecules, approximately $10^{23}$, every one of which is of exactly the same structure and length. Such polyphenylene-based molecular wires, shown in FIGS. 1A and 1B, have come to be known as Tour wires. While the Tour wires provide conductive leads, the molecular-scale electrical devices that they interconnect must have a structure and chemistry that is compatible therewith.

The source of the conductivity for a polyphenylene-based wire is the conjugated pi-type orbital that lies above and below the plane of the molecule when it is in its planar or near planar conformation, as shown in FIG. 4. In such a conformation, the pi-orbitals associated with the individual ring-like phenyl groups overlap to create a single pi-orbital that runs the length of the molecule, because of the significant energetic advantage that arises from delocalizing the pi-electrons over the length of the entire molecule. Because this long pi-orbital is both out of the plane of the nuclei in the molecule, and it is relatively diffuse compared to the in-plane sigma molecular orbitals, the pi-orbital forming a "channel" or "conduction band" that can permit transport of additional electrons from one end of the molecule to the other when it is under a voltage bias. In FIG. 5, such a pi-type conduction channel is sketched for a Tour wire.

In practice, as shown in FIG. 1B, triply bonded acetylenic linkages often are inserted as spacers between the phenyl rings in the Tour wire. These spacers eliminate the steric interference between hydrogen atoms bonded to adjacent rings. Otherwise, these steric interferences would force the component rings in the Tour wire to rotate into a non-planar conformation that would reduce the extent of conjugation between adjacent rings, break up the electron channel, and decrease the conductivity of the wire. The acetylenic linkages themselves, because of their own out-of-plane pi-electron density become a part of the electron channel, and thus, they permit the conductivity to be maintained throughout the length of the molecule.

Aliphatic Insulators

On the other hand, aliphatic organic molecule, singly bonded molecules that contain only sigma bonds on the axes of the atoms bonded to form the molecule, do not form an uninterrupted channel outside the plane of the nuclei in the molecules. They have nodes or breaks in the electron density at the positions of the atomic nuclei. Therefore, such singly bonded structures cannot transport an unimpeded electron current when they are placed under a voltage bias. That is, aliphatic chains, or groups, shown in FIG. 6, act as insulators. It follows then that when a small aliphatic group is inserted into the middle of a conductive polyphenylene chain, it breaks up the conductive channel and is said to form a barrier to electron transport.

Conductive Carbon Nanotubes

The second type of demonstrated molecule conductor is, as mentioned above, the carbon nanotube, also known as a buckminsterfullerene tube (or buckytube). This type of structure can make an extremely conductive wire. On the other hand, buckytubes, having only been discovered and characterized within the past two decades, do not have a very well-defined chemistry. Buckytubes tend to be very stable structures when formed, such that their chemical formulation and manipulation in bulk chemical processes only occurs under relatively extreme conditions. Such reactions tend not to be very selective or precise in the range of buckytube structures. The selection of buckytubes for use in electronic devices requires the use of physical inspection and manipulation of the molecules one by one, in order to segregate the molecules of choice from among many carbon nanotube molecules, some of which may have a range of different structures.

Molecular Diodes

As is known, a diode is a two terminal switch, which can turn a current "on" or "off". Two types of molecular-scale electronic diodes have been demonstrated recently: (a) rectifying diodes, and (b) resonant tunneling diodes.

A molecular rectifying diode, or molecular rectifier, functions by making it more difficult to induce electrons to pass through it in one direction, usually termed the "reverse" direction, then in the opposite "forward" direction. Molecular rectifiers were first disclosed in the first scientific paper on the subject of molecular electronics, by Aviram and Ratner, in their 1974 work entitled "Molecular Rectifiers". Aviram and Ratner based their suggestions for the structure of a molecular diode switch on the operational principles of the solid state, bulk-effect pn-junction diode which were well-known at the time. According to Aviram and Ratner, their molecular rectifier consists of a donor pi-system and an acceptor pi-system, separated by a sigma-bonded insulated bridge. The hemiquinone molecules shown in FIG. 7, were suggested as a prototype of a molecular rectifier. The quino (=O) groups on the left decrease the pi-density and raise the electron affinity, whereas the methoxy (—$OCH_3$) groups on the right increase pi-density and lower ionization potential. These two parts of the molecular rectifier are separated and insulated from each other by a dimethylene (—$(CH_2)_2$—) bridge, which is a sigma bridge. After nearly 25 years, the rectifying diode behavior of such molecular structures has been recently demonstrated. However, a device thus formed, as with quinones, is not readily bonded with polyphenylene conducting wires, and any such joining results in a great loss of conductivity.

In view of extremely high suitability of Tour wires for molecular electronic structures, several other types of non-rectifying molecular diodes have been devised based on polyphenylene wires as the "backbone". For instance, a molecular resonant tunneling diode (RTD) has been developed, which takes advantage of energy quantization in a manner that permits the amount of voltage bias across the source and drain contacts of the diode to switch "on" and "off" and electron current travelling from the source to the drain. Depicted in FIG. 8A, is a molecular resonant tunneling diode (RTD) that has been synthesized by James M. Tour and demonstrated by Mark A. Reed in 1997. Structurally and functionally, the device is a molecular analog of the much larger solid state RTDs that for the past decade have been fabricated in quantity in III–V semiconductors. Based upon a Tour wire backbone, as shown in FIG. 8A, Reed's and Tour's polyphenylene molecular RTDs are made by inserting two aliphatic methylene groups into the wire on either side of a single benzine ring. Because of the insulating properties of the aliphatic groups, as discussed in previous paragraphs, they act as potential energy barriers to current flow. They define the benzine ring between them as a narrow, approximately 0.5 nm, "island" of lower potential energy through which electrons must pass in order to traverse the length of the molecular wire.

Whenever electrons are confined between two such closely spaced barriers, quantum mechanics restricts their energies to one of a finite number of discrete quantized levels. This energy quantization is the basis for the operation of the resonant tunneling diode. The only way for electrons to moderate kinetic energies to pass through the device is to tunnel, quantum mechanically, through the two barriers surrounding the "island". The probability that the electrons can tunnel from the source region onto the island is dependent on the energy of the incoming electrons in the source compared to the unoccupied energy levels on the island of the device. As illustrated in FIG. 8B, if the bias across the molecule produces incoming electrons with kinetic energy, that differ from the unoccupied energy level available inside the potential well on the island, the current does not flow. The RTD is switched "off".

However, if the bias voltage is adjusted so that the kinetic energy of the incoming electrons aligns with that of one of the internal energy levels, as shown in FIG. 8C, the energy of the electrons outside the well is said to be in resonance with the allowed energy inside the well. Then, current flows through the device, i.e., the RTD is switched "on".

Although using a polyphenylene wire, this molecular resonant tunneling diode is not a rectifying diode, nor does it use a donor-acceptor principle of the rectifying diode.

U.S. Pat. No. 5,475,341 to Reed discloses a microelectronic semiconductor integrated circuit device integrated on a common substrate with molecular electronic devices, having a barrier-well-barrier structure with the well being conductive oligomer. Similar to the molecular RTD discussed in the foregoing paragraphs, the molecular electronic devices, disclosed in the '341 Patent, are not donor-acceptor complex based diodes.

The published International Application WO93/25003 is directed to a sub-nanoscale and electronic system, in which micro-electronic semiconductor integrated circuit devices are integrated on a common substrate with molecular electronic devices. Disclosed is a process of a self-aligning of molecular wires to their target terminals. Polymeric molecular structures are manipulated to produce combinations of well and barrier regions with connections, so that the well and/or barrier potential can be manipulated. Thus, the structures disclosed in the WO93/25003 connect to the molecular wires, as opposed to being formed therein, nor does the reference disclose donor-acceptor principles as a basis for a rectifying diode.

U.S. Pat. No. 3,953,874 is directed to an organic electronic rectifying device. In this system, hemiquinone is utilized to form asymmetric donor acceptor structures. However, the reference does not suggest use of polyphenylene conductors into which a molecular rectifying diode is formed.

Despite the benefits of polyphenylene conducting wires in nanometer-scale, molecular electronics, there was no suggestion in the prior art of using Tour wires as the conductive backbone for rectifying diodes. Nor has the prior art suggested chemical modification of molecular conductive wires for implementing donor-acceptor principles to embed rectifying diodes in the wire itself. Further, there is not a teaching or suggestion in the prior art of conductive molecular electronic digital logic structures i.e., AND, OR, and XOR gates, based on molecular rectifying diodes. Nor has there been disclosed or suggested such complex conductive molecular logic circuits as a molecular HALF ADDER or molecular FULL ADDER, using a polyaromatic conductive wire backbone.

SUMMARY OF THE INVENTION

It is therefore an object of the present invention to provide a monomolecular rectifying diode structure formed by selective doping of a molecular conducting wire having a plurality of primarily aromatic rings. The selective doping forming one or more respective donor and/or electron acceptor sites.

A further object of the invention is to provide electrically conductive monomolecular digital logic structures. The monomolecular digital logic structures include such Boolean functions as a monomolecular AND gate, a monomolecular OR gate, a monomolecular XOR gate, a monomolecular HALF ADDER, and a monomolecular FULL ADDER. The monomolecular logic structures are formed from monomolecular rectifying diode structures and operate by the conduction of electrical current with a bias voltage applied to the molecular circuit.

In accordance with the teachings of the present invention, a monomolecular electronic device is provided. The device comprises at least one molecular conducting wire having a plurality of joined substantially identical aromatic ring structures. A molecular insulating group is bonded between a respective pair of the aromatic ring structures to establish two sections of the conducting wire. The monomolecular electronic device further includes a doping structure for at least one of the two sections of the conducting wire, to form at least one of an electron donor site and an electron acceptor site. That combination integrally forms a current carrying rectifying diode in the molecular conducting wire, the combination being a single molecule.

Viewing the present invention from another aspect, the present invention is directed to a monomolecular electronic rectifying device that includes a polyphenylene-based conducting wire having a plurality of joined molecular ring structures. The rectifying device further includes a molecule of an insulating group bonded between a respective pair of the molecular ring structures to establish two sections of the conducting wire. A first dopant bonded to a respective one of the two sections is included to form a respective electron donor site. Additionally, a second dopant bonded to the other of the two sections is also included to form an electron acceptor site. That combination integrally forms a rectifying diode in the conducting wire.

Viewing the present invention from still another aspect, the present invention is directed to a monomolecular logic structure that includes a first molecular conducting wire having a rectifying diode embedded therein. The first molecular conducting wire has an end for receiving a fist input signal current. The logic structure also includes at least a second molecular conducting wire having a rectifying diode embedded therein. The second molecular conducting wire has an end for receiving a second input signal current. The logic structure further includes at least one node defined by an aromatic ring chemically bonded to a respective portion of both the first and second molecular conducting wires. An output molecular branch chemically bonded to the node is also provided. The output molecular branch is formed by at least one aromatic ring. A resistive molecular branch joined to the node is further provided for applying a reference potential thereto and the combination of elements thereby defining a single molecule for combining the first and second input signal currents in accordance with a predetermined Boolean logic function. The predetermined Boolean logic function may include an AND gate, an OR gate, an XOR gate, a HALF ADDER, a FULL ADDER, and combinations thereof.

From a yet further aspect, the present invention is directed to a monomolecular logic structure that includes a plurality of molecular conducting wires joined together to form a single molecule having a predetermined structure. A selected portion of the plurality of molecular conducting wires each being chemically doped to form a current carrying rectifying diode therein. The predetermined structure defining a predetermined Boolean logic function that may include an AND gate, an OR gate, an XOR gate, a HALF ADDER, a FULL ADDER, and combinations thereof.

These and other novel features and advantages of this invention will be fully understood from the following Detailed Description and the accompanying Drawings.

BRIEF DESCRIPTION OF THE DRAWINGS

FIG. 1A is a schematic representation of a polyphenylene chain;

FIG. 1B is a schematic representation of the polyphenylene-based chain, where phenyl and phenylene groups are separated by acetylenic or ethynylene spacers;

FIG. 2 shows a single benzene ring in several equivalent symbologies;

FIG. 3A shows a single phenyl group;

FIG. 3B shows a single phenylene group;

FIG. 4 schematically shows a side view of the principle bonds in a benzenoid structure;

FIG. 5 schematically shows a pi-type conduction channel for a Tour-type polyphenylene-based molecular wire;

FIG. 6 schematically shows examples of aliphatic molecular insulators;

FIG. 7 schematically shows a rectifying diode hemiquinone structure as described by Aviram and Ratner;

FIG. 11A schematically shows an exemplary polyphenylene based molecular OR gate of the present invention;

FIG. 11B shows an electrical schematic circuit diagram for a diode logic OR gate circuit;

FIG. 11C is a truth table for the OR gate of the present invention;

FIG. 13B is a logic diagram for a HALF ADDER;

FIGS. 13C and 13D show truth tables for each of the gates of the HALF ADDER of the present invention;

DESCRIPTION OF THE PREFERRED EMBODIMENTS

Figure 8A:
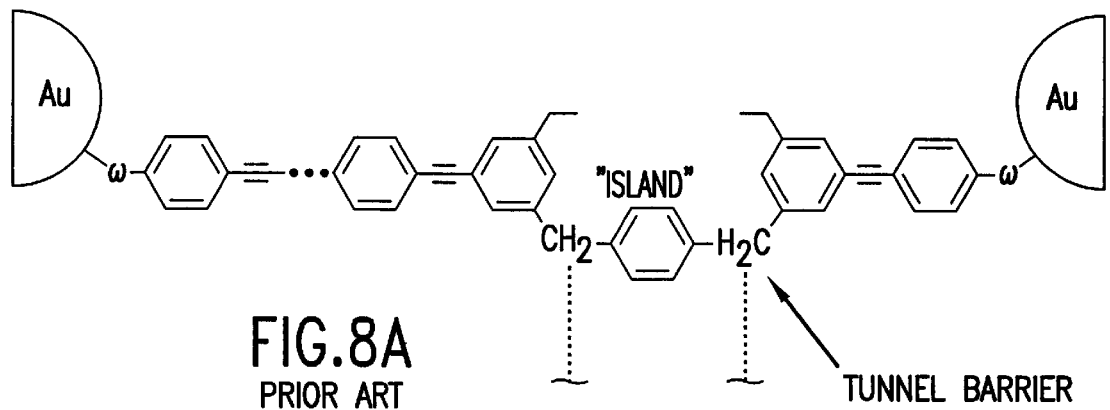
FIGS. 8A, 8B and 8C schematically show the structure and the operation of a molecular resonant tunneling diode demonstrated by Reed and Tour.
Figure 8B:
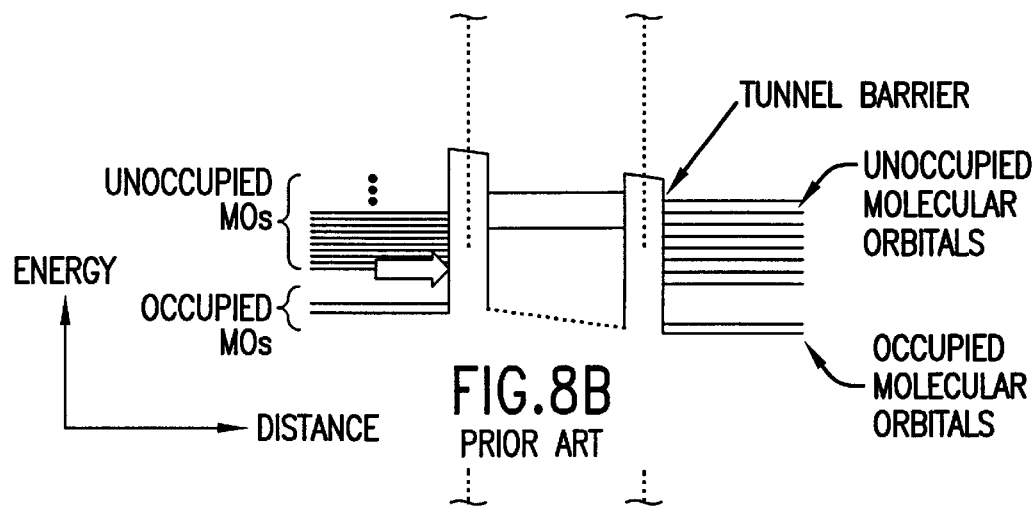
Figure 8C:
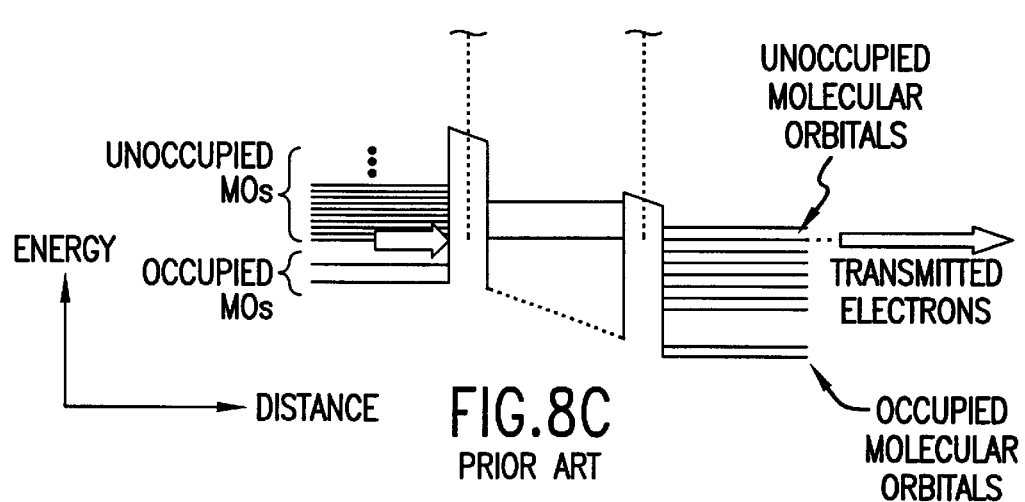
Figure 9A:
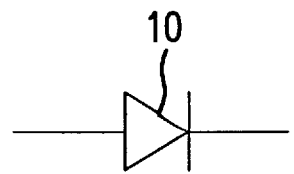
FIGS. 9A, 9B, 9C, 9G, 9H and 9I respectively show a rectifying diode symbol, a schematic representation of a molecular rectifying diode structure of the present invention, a schematic representation of the present invention having a single dopant and exemplary schematic representations thereof.
Figure 9B:
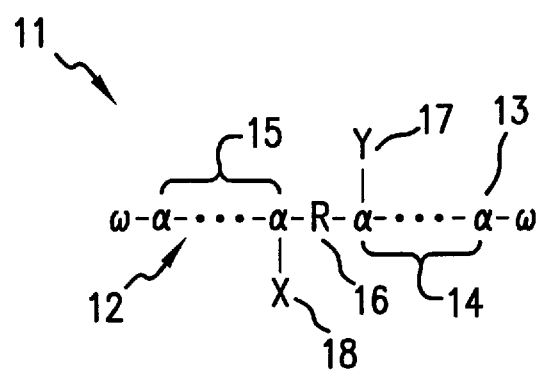

Referring to FIGS. 9A and 9B, a rectifying diode 10 has a molecular structure 11 which is based on a polyaromatic conducting wire 12 which comprises a plurality of sequentially bonded substantially identical aromatic ring structures 13. As applied herein, a molecular conducting wire is a single molecule having a plurality of substantially identical ring structures bonded or linked together, sequentially and/ or in parallel, that form an electrically conductive molecular chain or mesh. By "linked" aromatic rings, it is meant that the rings are singly or multiply bonded to each other or to intervening carbon atoms or hydrocarbon groups. The use of the term aromatic ring is meant to include ring molecular structures having substantially aromatic character, such as rings into which heteroatoms have been inserted and bonded in the ring. Such heteroatoms being atoms other than carbon, for example atoms selected from elements in groups III, IV, and V of the Periodic Table, like Boron, Silicon, or Nitrogen. The conductive molecular wire may be formed of such rings as benzene, cyclopentadiene, cyclopropene, and combinations thereof.

The single molecule 11 has two sections 14 and 15 thereof separated by an insulating group 16, represented by an R. The section 14 of the molecule 11 is doped by at least one electron withdrawing group, represented by a Y, bonded thereto. The section 15 of the molecule 11 is doped by at least one electron donating group 18, represented by an X, bonded thereto. The aromatic rings are linked together with respective X and Y group dopants being bonded to one or more sites of the respective sections of the conducting wire. The bonding of the insulator and dopants to the conducting wire can be carried out by conventional insertion and substitution reactions well known in the art.

Figure 9C:
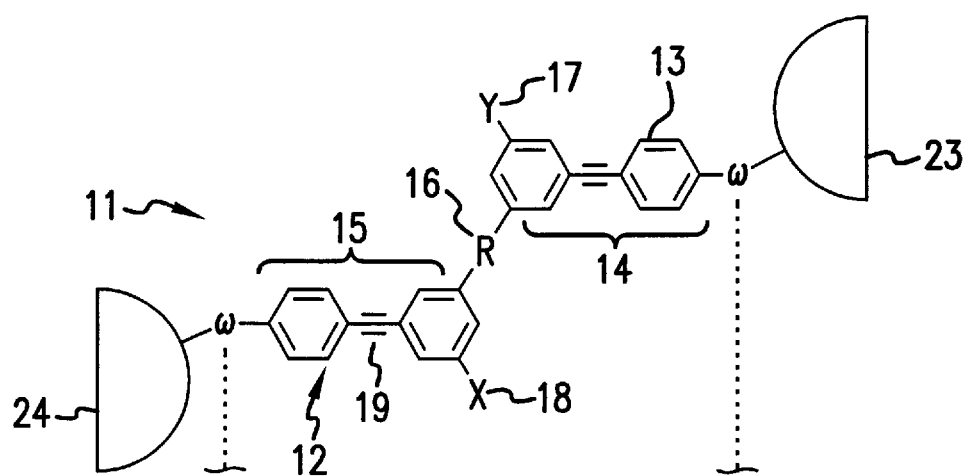

FIG. 9C shows an example of the molecular structure 11 for a rectifying diode integrally embedded in a polyphenylene-based molecular conducting wire 12. Here, benzene rings 13 are linked by triply bonded ethynylene linkages 19. The triply bonded ethynylene linkages 19 are inserted as spacers between the rings 13 in order to eliminate the steric interference between hydrogen atoms bonded to the adjacent rings 13. An insulator 16 is incorporated into the conducting wire by bonding a saturated aliphatic group, or a group having a predominate aliphatic character with respect to electron transport (no pi-orbitals), therein. The addition of the insulator 16 divides the conducting wire into two sections 14 and 15. The section 14 is doped to form an electron acceptor site, and the section 15 is doped to form an electron donor site. Although only one electron donor site and one electron acceptor site are shown, multiple sites may be incorporated into the structure to adjust the voltage drop across the insulator 16. The respective ends of the conducting wire are joined to contacts. The conductivity of that connection is improved by the substituent group ω respectively bonded at the ends of the conducting wire, that chemically binds to an electrical contact.

Figure 9D:
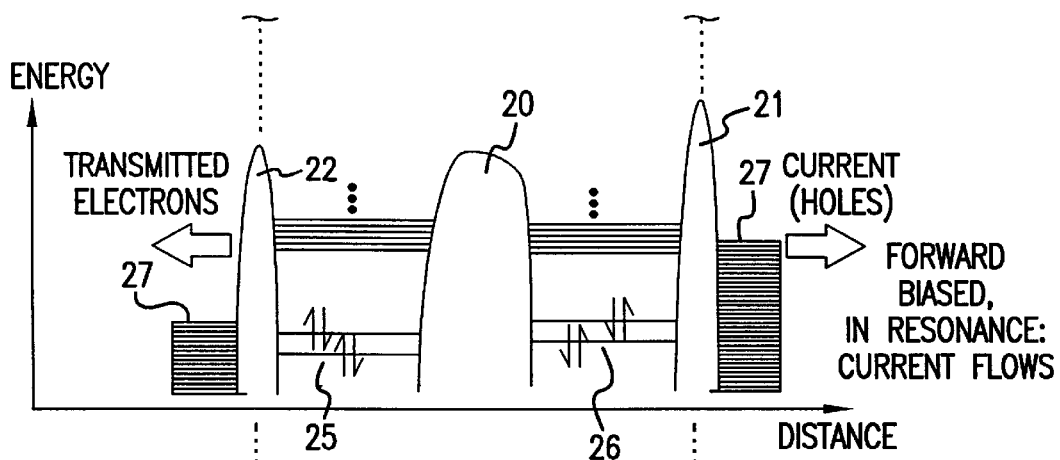
FIGS. 9D, 9E and 9F show schematically the orbital energy diagram associated with a polyphenylene monomolecular rectifying diode structure of the present invention when the molecule has an applied "reverse" bias, an applied "forward" bias, and a "zero bias" respectively.
Figure 9E:
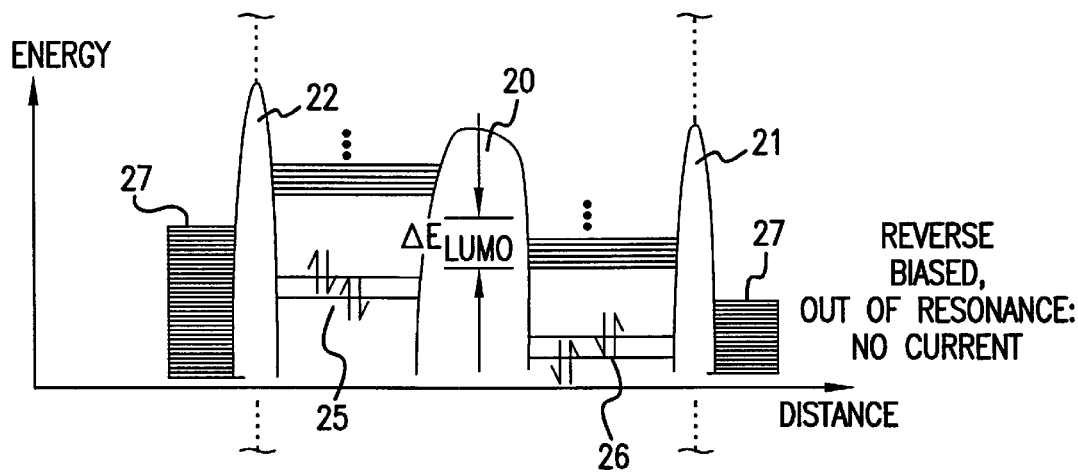

Comparing the molecular structure 11 shown in FIG. 9C with potential energy diagrams shown in FIGS. 9D and 9E, it may be observed that the insulating group 16 in substantially the middle of the molecule 11 is associated with a potential energy barrier 20. There are also barriers 21 and 22 between the molecule 11 and the conductive contacts (for instance gold) 23 and 24 at either end of the molecule 11 formed by substituents ω having a characteristic for selective attachment in the particular atomic or molecular structure of the contacts 23, 24. These barriers 20, 21, and 22 serve to maintain a degree of electrical isolation between the different parts of the structure, sufficient to prevent the energy levels of the sections 14 and 15 from coming into equilibrium. However, none of these barriers are so wide or high as to completely prevent electrons under a bias voltage from tunneling through them. The material of the contacts 23, 24 may be a metal or conductive non-metal, such as buckytubes. The insulating group R could be any group that is more insulating than the polyaromatic chain 12. Some candidates for this role include aliphatic groups such as sigma bonded methylene groups (—$CH_2$—) or dimethylene groups (—$CH_2CH_2$—).

Figure 9F:
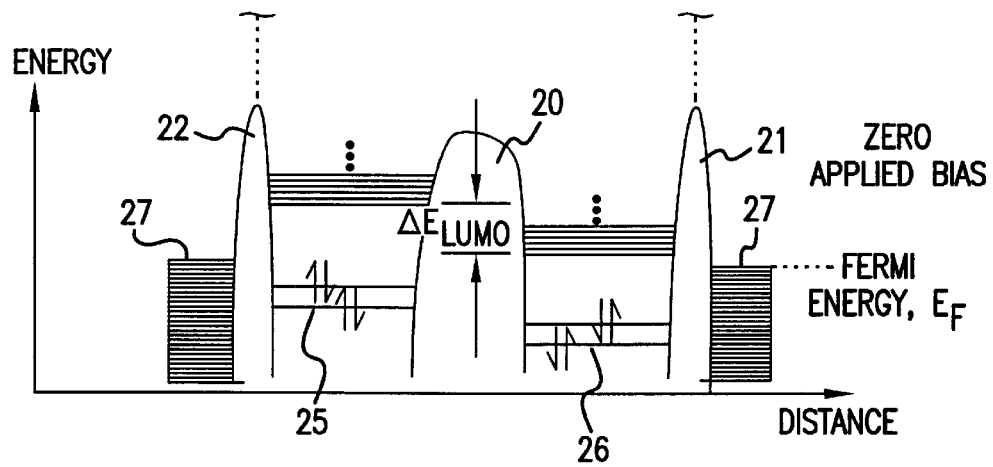
Figure 9G:
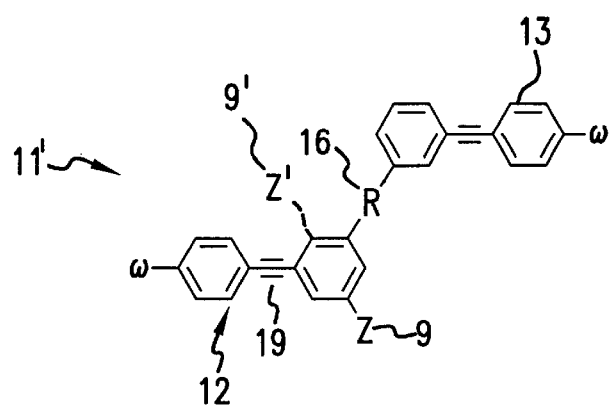

As shown in FIG. 9G to the left of the central barrier 20, all the pi-type valence energy levels 25 are elevated in energy because of the presence of the electron donating group 18 designated by an X. This includes both the highest occupied molecular orbital (HOMO) and the lowest unoccupied molecular orbital (LUMO). Among the possible electron donating substituents, the following examples of suitable substituents for the purposes of the present invention include: —$NH_2$, —OH, —$CH_3$, —$CH_2CH_3$, etc.

In the context of modern molecular quantum mechanics, it should be understood that an electron donating group bonded to an aromatic ring tends to place a greater electron density upon the ring or where multiple X groups are bonded to several conjugated aromatic rings, a greater electron density upon multiple rings, under a zero applied bias. This increases the amount of mutual repulsion among the electrons in the molecular orbital associated with the ring structure, or conjugated ring structure. In the case of the conjugated ring structure, to the left of the central barrier 20, this additional repulsive interaction raises the total energy, as well as its component orbital energies.

To the right of the central barrier 20, all the pi-type valence energy levels are lowered in energy because of the presence of the electron withdrawing group 17, designated by a Y. This includes both the HOMOs and the LUMOs on the acceptor side. Examples of the electron withdrawing substituents suitable for the purposes of the present invention, include —$NO_2$, —CN, —CHO, —COR', etc., where R' is an aliphatic chain. The electron withdrawing group 17 is bonded to a ring 13 or multiple groups 17 are respectively bonded to several conjugated aromatic rings 13. These groups tend to remove electron density from the respective ring or rings 13, thereby reducing the amount of electron repulsion among the electrons associated with the ring structure, or conjugated ring structure. These diminished repulsive interactions lower the total energy of the structure to the right of the central barrier 20, as well as its component orbital energy, under a zero bias condition.

The addition of one or more dopant substituents provides, in a sense, a "pre-bias" across the barrier 20. This pre-bias or dopant induced difference in the orbital energy levels on the two sections of the molecule 11 exists even when there is zero externally applied bias, as shown in FIG. 9F. That pre-bias must be overcome for electrons to flow from the electron acceptor doped section to the electron donor doped section, tunneling through barrier 20. The difference in energy ($\Delta E_{LUMO}$) between the orbital energy of the donor LUMO ($E_{D-LUMO}$) and the orbital energy of the lowest-energy orbital on the acceptor ($E_{A-LUMO}$), established by the doping of conducting wire sections, make possible the rectifying diode operation.

The induced difference in the relative energetic positions of the valence pi-orbitals 25 in the donor and valence pi-orbitals 26 in the acceptor sections 15 and 14, respectively, of the molecule 11, at zero externally applied voltage bias, provides the basis for operational principles of a monomolecular rectifying diode 10 embedded in a molecular conducting wire. These operational principles are described in detail in the following paragraphs.

As shown in FIG. 9D, a forward voltage bias has been placed upon the molecule 11 of FIG. 9C, with a high voltage on the contact 24 (left hand contact) and a lower voltage on the contact 23 (right hand contact), then the electrons in the occupied quantum levels of the lower voltage right hand section 14 are induced to flow from right to left through the molecule 11 to reach the higher voltage right hand section 15. That flow of electrons is a result of an energy differential formed by the applied bias voltage, the electrons being drawn to the section having an opposite charge.

The occupied quantum levels in each contact are represented by the closely spaced horizontal lines 27 at the far left and the far right of FIGS. 9D, 9E and 9F. The energy of the highest of these occupied levels 27, the Fermi level, in the metal contact is known as the Fermi energy ($E_F$). Applying a forward bias voltage tends to raise the Fermi level of the low voltage contact and lower the Fermi level in the other one. Then, for this right to left flow of electrons to occur under a forward bias, the differential voltage bias must be sufficient to raise the Fermi energy of the electrons in the occupied levels of the gold contact 23 at least as high as the energy of the LUMO pi-orbital in the acceptor section 14 of the molecule 11. This is in accordance with the Pauli exclusion principle, where more electrons are prevented from entering the lower energy HOMO pi-orbitals in the acceptor half of the molecule, since they already are doubly occupied and the electrons therein cannot tunnel off to the left.

However, if the Fermi energy of the contact 23 is raised up to or above the energy of the LUMOs on the acceptor section, by the forward bias voltage, the electrons can tunnel from contact 23 into the empty LUMOs immediately to the left. Then, the electrons can tunnel to the left, once again, through the central insulating barrier 20 to the unoccupied manifold of molecular orbitals in the donor section 15 of the molecule 11. The molecular orbitals in donor section 15 are sufficiently lowered in energy by the forward bias voltage so that one or more of them matches a LUMO in the acceptor section 14 of the molecule 11, as depicted in FIG. 9D.

As it will be appreciated by those skilled in the art, in the forward bias case, the amount of voltage that must be applied is not likely to be very great in order to start electrons flowing by raising the Fermi energy of the contact 23 sufficiently to exceed the LUMO energy of the acceptor section 14 of the molecule 11. This is because all the energy levels of the acceptor section 14 have been lowered in advance by the presence of the substituent electron withdrawing group 17 bonded to the section 14.

On the other hand, it is not so easy a matter to start electron flow when a reverse bias voltage has been placed upon the molecule 11, as illustrated schematically in FIG. 9E. In the reverse-bias case, with the higher voltage on the contact 23 and the lower voltage on the contact 24, the electrons in the right hand contact 24 normally would tend to flow from left to right through the molecule 11. To actually start this electron flow, though, the reverse bias voltage must be sufficient to raise the Fermi energy of the contact 24 so that it is at least as high as the energy of the LUMO pi-orbitals in the donor section 15 of the molecule 11. In the reverse bias case, however, the amount of voltage that must be applied is considerably greater than in the forward bias case, in order to raise the Fermi energy of the contact sufficiently to exceed the LUMO energy of the adjoining portion of the molecule 11. This is because all the energy levels of the donor section 15 have been raised in advance by the presence of the substituent donating group 18 bonded to the section 15 of the molecule 11. Such high voltage level is analogous to a reverse breakdown voltage of conventional semiconductor devices.

Figure 9H:
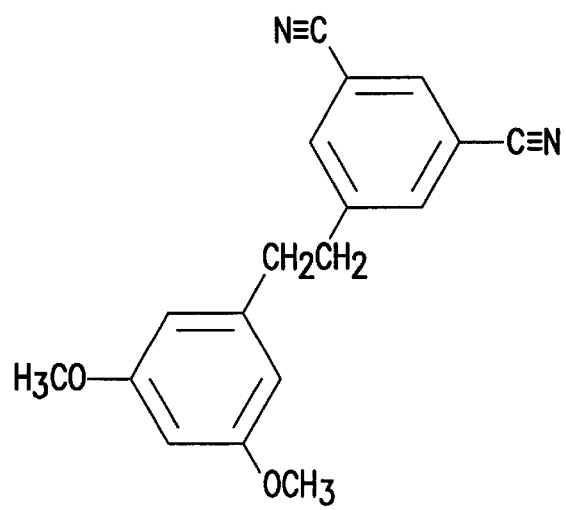
Figure 9I:
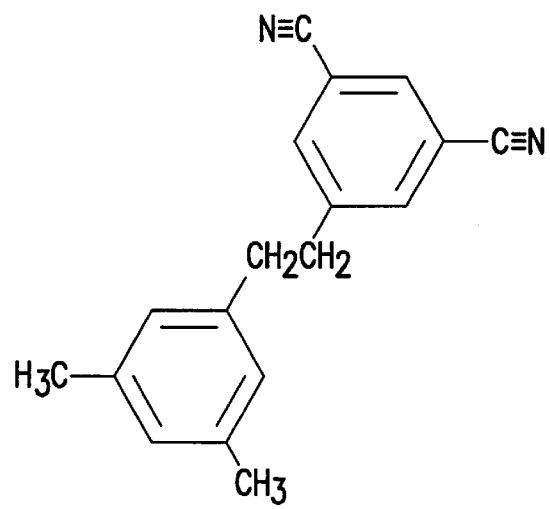

As shown in FIG. 9E, the same amount of voltage is applied in the reverse direction as is used in the forward direction (FIG. 9D), and such is insufficient to allow electrons to tunnel from the contact 24 into the LUMO energy level of the molecule 11. The different forward and reverse bias characteristics of molecule 11 defines the classic behavior of a rectifying diode, which is symbolized by the schematic symbol shown in FIG. 9A. An example of such a rectifying diode is defined by a dimethoxy-dicyano polyphenylene-based molecule, as shown in FIG. 9H. Another example is shown in FIG. 9I, where a dimethyl-dicyano polyphenylene-based molecule defines a rectifying diode.

As shown in FIG. 9B, the respective ends of the sections 14 and 15 of the molecule 11 are provided with a substituent for increasing (enhancing) the conductivity between the respective end of molecule 11 and the associated conductive contact (e.g. the metal gold or carbon nanotubes). Such substituents as sulfur or thiocyanate, for example, can be used with contacts 23 and 24.

The doping of molecule 11', shown in FIG. 9G, can be by one or more substituent groups 9, 9' of a single type, electron donor or electron acceptor, on one side of the insulating barrier 16. With only one of the dopant types being present, without the other, an energy difference may still be induced. Such an energy difference created by a single dopant type on the molecule 11' can permit rectifying diode operation. A rectifying diode formed by molecule 11' will have a smaller voltage drop across the barrier than the molecule 11, shown in FIG. 9C, but may be easier to synthesize. The voltage drop across the barrier can be raised to some degree by the bonding of dopant substituents 9', designated Z', to one or more additional dopant sites. The additional dopant substitutent 9' may be the same dopant group as substituent Z or another of the same type (donor or acceptor).

The monomolecular diode structure 11, in accordance with the concepts established by the instant invention, can serve as a building block for synthesis of a single molecule that logic carries out a Boolean function, such as AND, OR, XOR, or the like gates, and further larger single molecule structures performing more complex Boolean logic functions, for instance, HALF and FULL ADDERS. The principles of the present invention, however, are applied not only to those structures described herein in detail in further paragraphs, but also to other larger molecular electronic units and circuits formed by combination of the disclosed molecular logic devices.

Therefore, despite the fact that diodes cannot, by themselves, produce power gain, they can, nevertheless, be used to design and to construct a functionally complete family of logic devices, which includes AND gates, OR gates, and XOR gates (or NOT gates), from which many more complex Boolean logic functions may be designed and constructed.

Figure 10B:
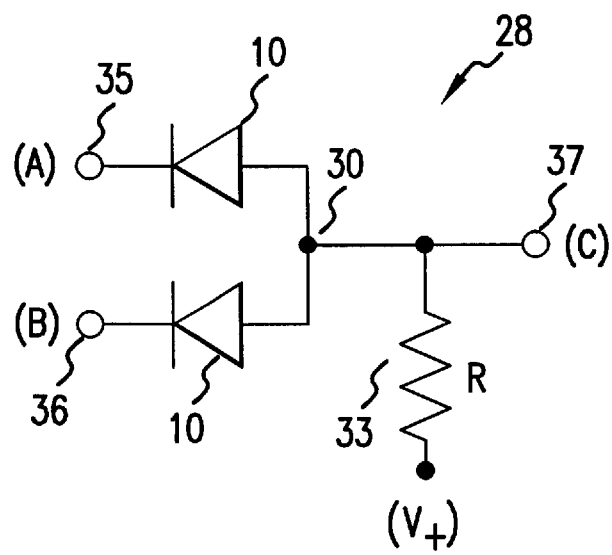
FIG. 10B shows an electrical schematic circuit diagram for a diode logic AND gate circuit.
Figure 10A:
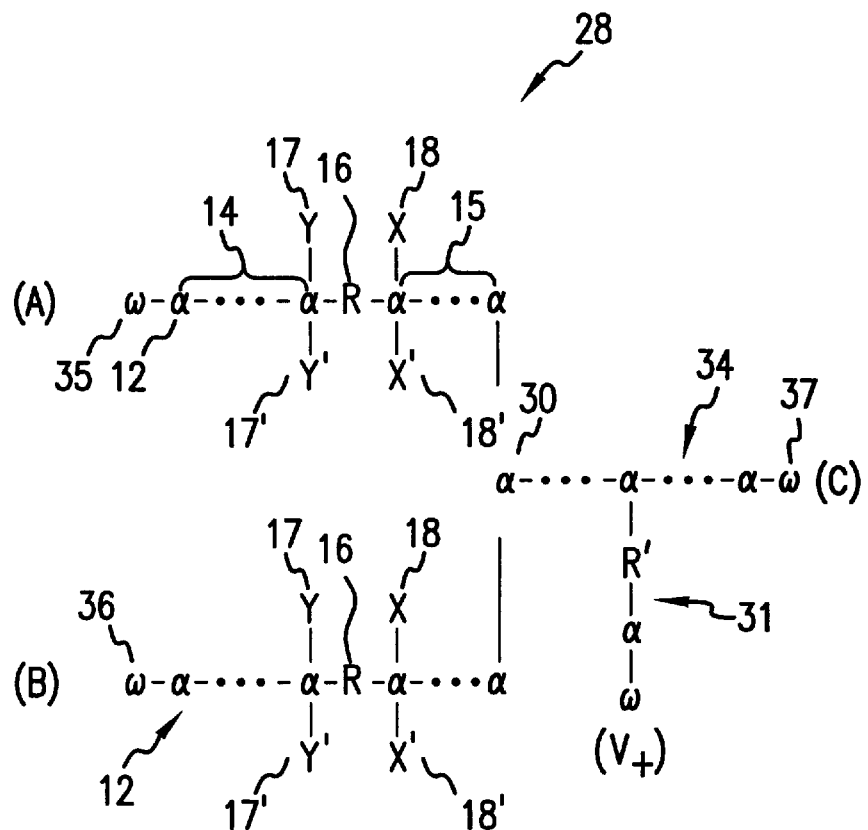
FIG. 10A schematically shows a representative molecular structure for the AND gate of the present invention.

Shown in FIGS. 10A and 10B is a molecular structure for a diode-based AND gate and a schematic circuit for the diode-based AND gate, respectively. The molecular structure of the gate uses the previously discussed rectifying wires as a building block upon which it is constructed. The single molecule AND gate 28 is formed with at least two conducting wires 12, each of which has a donating section 15, an accepting section 14, at least one electron donating group 18, at least one electron withdrawing group 17, and a respective insulating group 16 inserted between the sections 15 and 14. Donor substituents X and X' are each bonded to a respective site of the section 15, as are the acceptor substituents Y and Y' bonded to respective sites of the section 14. An increase in the number of donor and acceptor sites usually increases the center barrier voltage for the rectifying wire. Each of the multiple substituents X, X' and Y, Y' may be the same chemical group or different ones of the same dopant type. Where conductive contacts are to be connected to the molecule, a conductivity enhancing substituent ω may be utilized. Both conducting wires 12 are bonded at their ends, thereby forming a connecting node 30. An insulating aliphatic chain 31 is bonded to the connecting node 30. The aliphatic substituent R' is selected from the same set of substituents as are used for the insulator 16, but not necessarily the same substituent. Another polyaromatic conducting wire 34 is bonded to the connecting node 30 and extends therefrom to provide connection to a conductive contact at the gate output C. Each of the individual molecules of the two rectifying wires 11, the aliphatic chain 31, and the polyaromatic wire 32 are chemically joined together to form a larger single molecule. The assembly of this AND gate, and the other logic devices to be discussed, may be accomplished by conventional insertion and substitution technique alone, or in combination with manipulation, using a scanning tunneling electron microscope or other nano-probe.

Figures 10C, 10D:
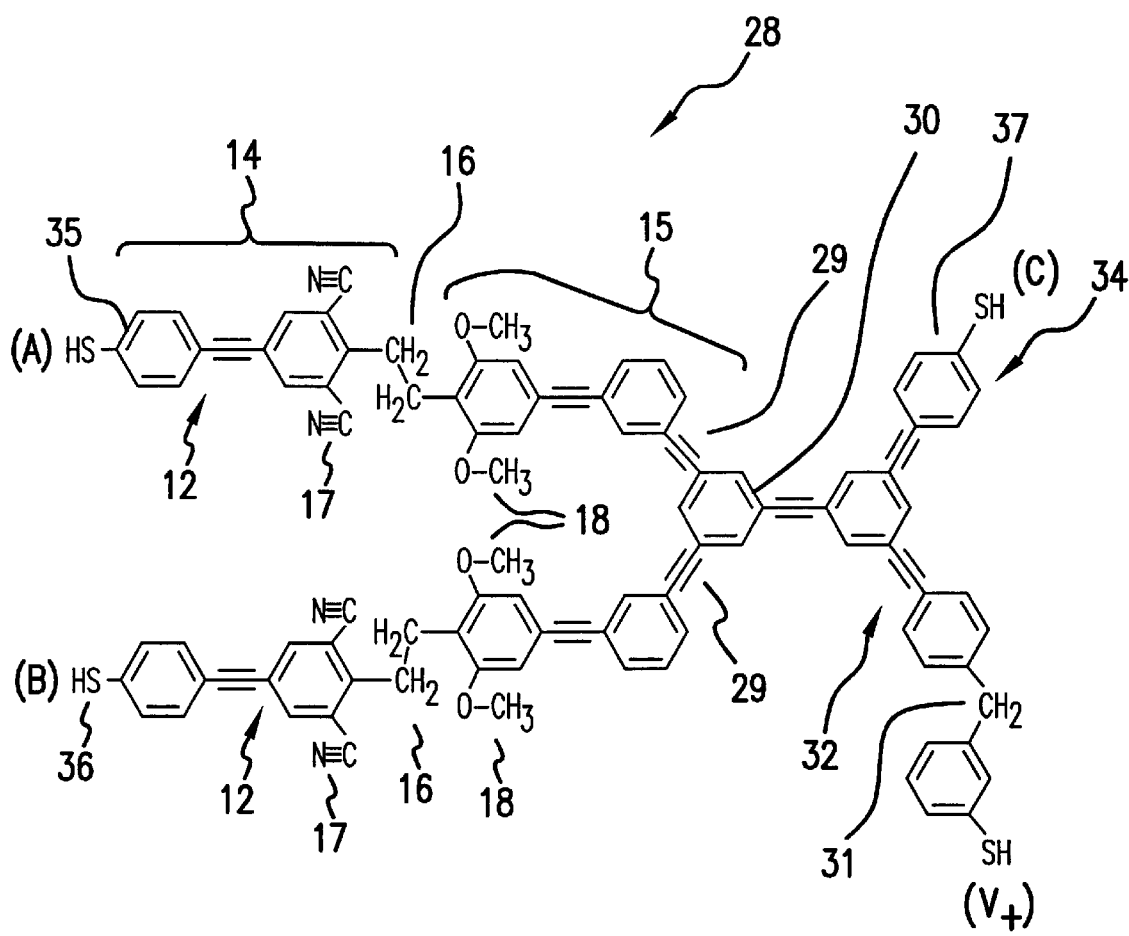
FIG. 10C schematically shows an exemplary polyphenylene-based molecular AND gate of the present invention.
FIG. 10D is a truth table for the AND gate of the present invention.

An example of a polyphenylene-based molecular AND gate 28 is shown in FIG. 10C, such being functionally equivalent to a schematic circuit for a diode-based AND gate, shown in FIG. 10B. The molecular AND gate in FIG. 10C includes a pair of diodes 10 having their anodes connected together and having their cathodes connected to respective input terminals A and B. The connecting node 30 of the anodes of the diodes 10 is connected to the output terminal C and also has a resistance extending from the node 30 to couple a bias voltage V+ thereto. As shown in the example of FIG. 10C, the molecular AND gate 28 has two input ends 35 and 36 and an output terminal 37 coupled to respective contacts A, B, and C. The truth table for the AND gate 28, shown in FIG. 10D, shows that the molecule exhibits classical behavior of a Boolean AND gate function.

It is noteworthy that this molecular logic gate, an AND gate, measures approximately 3 nm×4 nm, which is approximately one million times smaller in area than a corresponding gate fabricated using conventional semiconductor transistor technology.

Shown in FIGS. 11A–11C is an exemplary monomolecular logic structure constituting a single molecule OR gate. FIG. 11B shows the electrical schematic circuitry for a diode-based OR gate 38. The diode-based OR gate includes two diodes 10 with their cathodes connected together and their anode ends 43 being coupled to respective inputs A and B of the OR gate 38. A resistance 39 is coupled to the connecting point 40 of the cathodes of the diodes 10 for coupling a bias voltage thereto. A gate output C is coupled to the connection point or node 40. An exemplary molecular OR gate 38 is shown in FIG. 11A. The example depicts a polyphenylene-based structure and is formed by bonding a pair of rectifying wires together, each having an electron donating section 15 and an electron accepting section 14 separated by insulating group 16. Like the analogous AND gate previously discussed, the monomolecular OR gate can be formed by any conductive polyaromatic wires, of which the polyphenylene-based wire is but one. The acceptor sections 14 of the conducting wires 12 are bonded together to form a connecting node 40, wherefrom an insulating chain 41 of an aliphatic group extends through a polyphenylene-based wire. A larger resistance is formed by an insulating group consisting of aliphatic chain, as opposed to a single substituent. A polyphenylene-based wire 42 extends from the connecting node 40 for coupling the gate output C to a conductive contact. The unbonded ends 43 of the OR gate molecule 38 are coupled to gate inputs A and B, while the end 44 of the polyphenylene-based wire 42 constitutes the gate output C. The individual molecular rectifying wires, the polyphenylene wires and aliphatic chain combine together to form a single larger molecule, that molecule functioning as a logical OR gate. The truth table for the single molecule OR gate, shown in FIG. 11C, shows that the molecule exhibits the classical behavior of a Boolean OR gate function. Similar to AND gate 28, the monomolecular OR gate 38 measures approximately about 3 nm×4 nm, which is approximately one million times smaller in area than the corresponding gate fabricated on a semiconductor chip.

Figure 12A:
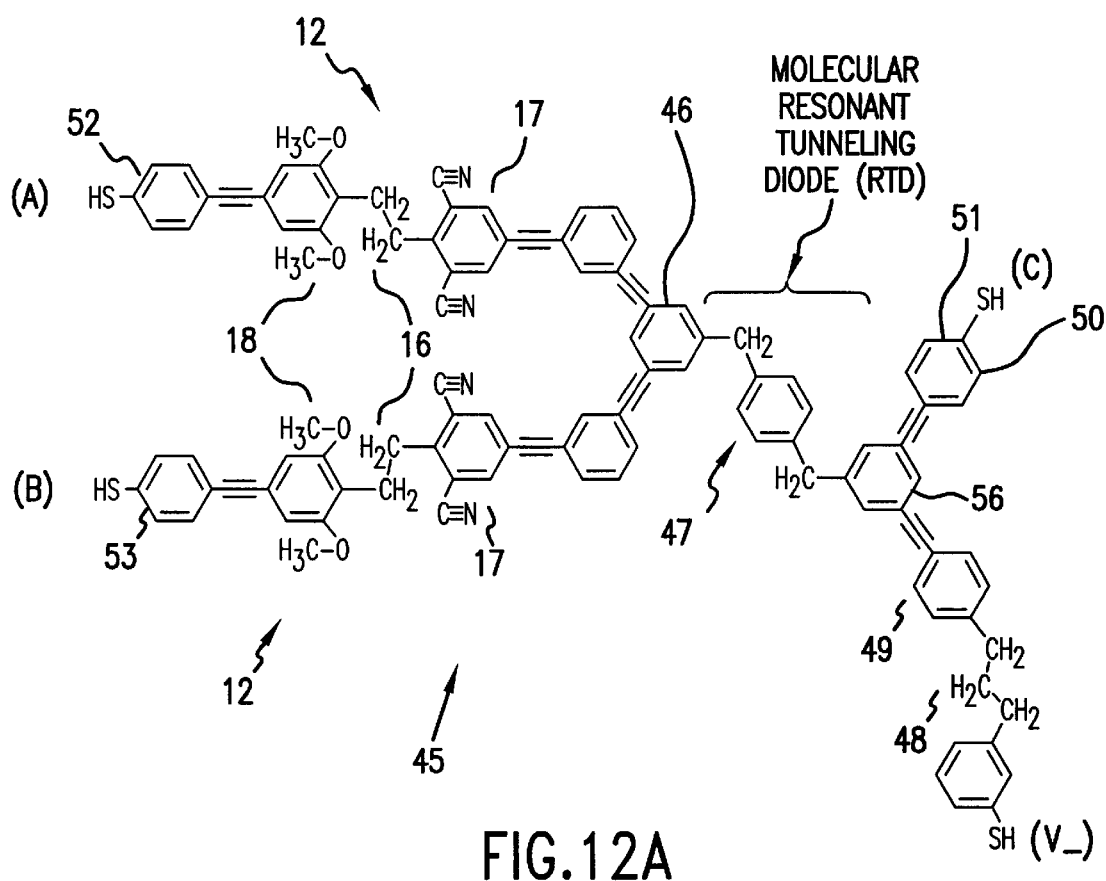
FIG. 12A is a schematic representation of an exemplary molecular structure for an XOR gate of the present invention.
Figure 12B:
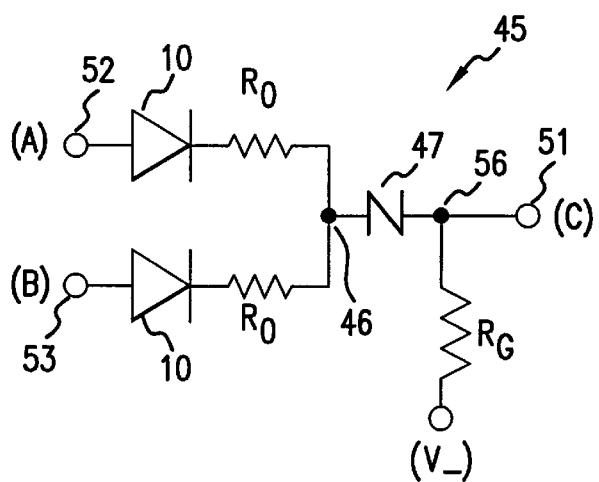
FIG. 12B shows an electrical schematic circuit diagram for a diode logic XOR gate circuit.

The monomolecular XOR gate uses a molecular resonant tunneling diode (RTD), to be described in following paragraphs, in combination with the molecular rectifying wires, as shown in FIG. 12A. The schematic diagram, shown in FIG. 12B, of the XOR gate 45 shows two rectifying diodes 10 having their cathodes connected together through resistances R0 at a connecting node 46, with a resonant tunneling diode 47 having one terminal coupled to node 46. A resistance $R_G$ is connected to the other terminal of the resonant tunneling diode 47 at a node 56, the node 56 being connected to the output terminal C.

As exemplary molecular implementation of the diode-based XOR gate is shown in FIG. 12A, and may have dimensions approximating 5 nm×5 nm. That monomolecular OR gate is built using a Reed-Tour molecular resonant tunneling diode and multiple polyphenylene-based molecular rectifying wires that are bonded together into a single molecule. The molecular circuit for the XOR gate 45 has similarities to that for the OR gate 38 discussed in previous paragraphs, but with insertion of the resonant tunneling diode 47 to change the output result in the case where both inputs are a logic level "1".

Figures 12C, 12D:
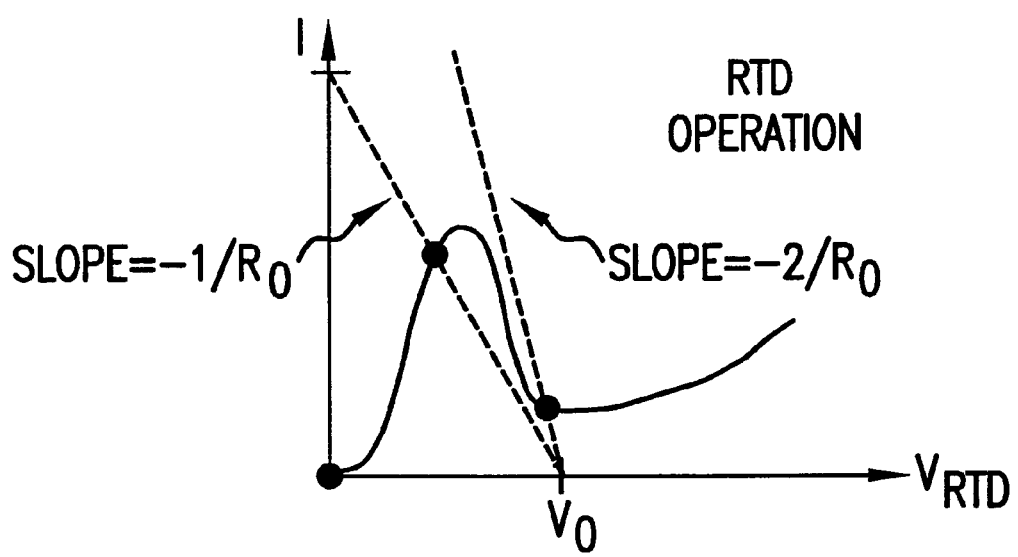
FIG. 12C is a truth table for the XOR gate of the present invention.
FIG. 12D is a current vs. voltage (I/V) diagram for the operation of an RTD incorporated into the XOR gate of the present invention.

Thus, the XOR gate 45 comprises a pair of the molecular conducting wires 12, as previously described, having acceptor sections that are chemically bonded at the connecting node 46. Each of the diode embedded wires has an effective "on" resistances $R_0$. The insulating chain 48 is a molecular implementation of a the resistance $R_G$. Chain 48 includes a plurality of sequentially joined insulating $CH_2$ groups and is connected to the node 56 via the polyphenylene-based conducting wire 49 into which the insulating chain is inserted. A polyphenylene-based conducting wire 50 extends from the point of connection 56 between the RTD 47 and the polyphenylene-based conducting wire 49. Polyphenylene-based conducting wire 50 has an end 51 constituting the output of the XOR gate 45 that is coupled to the output terminal C, through a conductivity enhancing substituent. As it is seen from FIG. 12A, the ends 52 and 53 of the molecule 12 constitute inputs of the XOR gate 45 and are connected to the input terminals A and B. The truth table for this circuit is shown in FIG. 12C.

The addition of a molecular XOR gate to the molecular AND and OR gates produces a functionally complete logic set, from which more complex logic circuits can be constructed. The XOR gate is readily adapted to function as a NOT gate, simply by fixing one of the input terminals to a logic "1" level, with AND, OR and NOT functions being combinable to form more complex Boolean functions.

The total voltage drop $V_T$ that is applied across the XOR gate is the sum of the effective voltage drop across the input resistances $V_{IN}$ that are associated with rectifying diodes 10, plus the voltage drop $V_{RTD}$ across the RTD 47, i.e., $$V_T = V_{IN} + V_{RTD} \tag{1}$$

Thus, the voltage drop across the RTD may be written as $$V_{RTD} = V_T - V_{IN} \tag{2}$$

The effective resistance of the part of the XOR gate containing the rectifying diodes 10 differs depending upon whether one or both of the two identical parallel inputs is "on". If only one of the inputs is "on" (e.g., A is 1 and B is 0), then the effective resistance of the input portion of the XOR gate is $R_o$. However, if both of the inputs are "on" (e.g., A is 1 and B is 1), the aggregate effective resistance of the input portion of the XOR gate is $R_o/2$. Thus, if a variable current I is passed through only one input to the gate, then the voltage drop across the input resistance is $V_{IN} = I \cdot R_o$. However, if a current I is passed through both inputs, then the voltage drop across the input resistances is $V_{IN} = I \cdot R_o/2$. It follows from these equations and from equation (2) that there are two possible operating equations for the gate. Depending upon the inputs, these two equations are approximately:

$$V_{RTD} = V_T - I \cdot R_o, \text{ if only one input is a logical 1} \tag{3a}$$

$$V_{RTD} = V_T - I \cdot R_o/2, \text{ if both inputs are a logical 1} \tag{3b}$$

By solving these two equations for the variable operating current through the XOR circuit, the approximate equations for the two possible operating lines for the circuit, which often are termed the "load lines" for the RTD in the XOR gate, are as follows:

$$I = -1/R_o \cdot (V_{RTD} - V_T), \text{ and input is 1} \tag{4a}$$

$$I = -2/R_o \cdot (V_{RTD} - V_T), \text{ both inputs are 1} \tag{4b}$$

These two straight lines, which have different slopes, but the same intersects on the V axis, as depicted in FIG. 12D. From that Figure, it may be observed that these two approximate operating lines for the circuit have two different points of intersection with the curved operating line for the RTD. These points of intersection are the "operating points" for the RTD.

Which of these two operating points applies, depends upon the inputs to the gates. For the case that only one input is a logic 1, equation (4a) yields the less steep "load line" and an operating point on the peak of the RTD operating curve where the RTD is "on" and the output of the gate is therefore a logical 1.

However, for the case that both inputs to the XOR gate are a logical 1's, equation (4b) and the steeper "load line" applies. The corresponding operating point is in the valley of the RTD operating curve, where the RTD is "off". Thus, the output of the XOR gate is likewise "off" (logical 0) when the inputs are logical 1's. This result, which is opposite from that produced by the same inputs in the ordinary or "inclusive" OR gate, is a consequence of the valley current shut off that is manifested by the RTD operation past its first peak on the I/V curve.

Figure 13A:
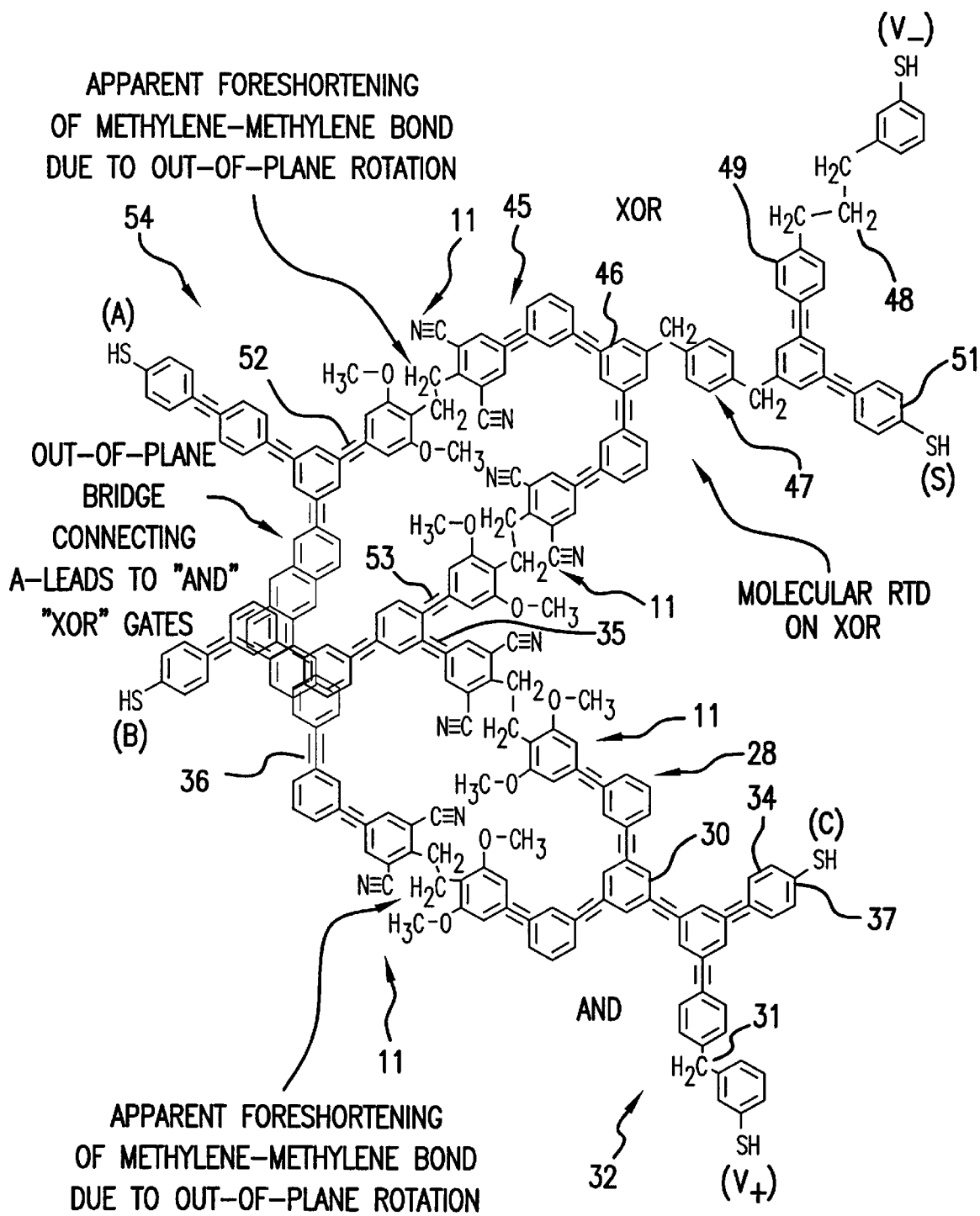
FIG. 13A is an exemplary schematic representation of the molecular structure for a HALF ADDER of the present invention.

The complete set of single-molecule logic gates discussed herein makes possible designs for molecular structures that implement higher Boolean logic functions. For example, by combining the structures for the molecular AND gate and the molecular XOR gate, a molecular HALF ADDER can be constructed as a single molecule, as shown in FIG. 13A. The combinational logic circuit schematic for a binary HALF ADDER 54 is shown in FIG. 13B, and an exemplary molecular polyphenylene structure corresponding to that combinational logic diagram is illustrated in FIG. 13A. As the building block of the more complex logic devices is the previously discussed rectifying wire, the variations in aromatics and substituents chemically inserted or substituted therein, equally apply to these more complex structures. The resulting molecular structure for the HALF ADDER has dimensions approximating 10 nm×10 nm, and behave in accordance with the truth tables shown in FIGS. 13C–13D. The structure in FIG. 13A is a single molecule that logically adds two binary numbers responsive to a flow of current representing the addends passed through it, the current being driven by an applied voltage representing a particular logic state.

As shown in FIG. 13A, the exemplary monomolecular HALF ADDER comprises an AND gate molecule 28 chemically bonded to a XOR gate molecule 46. As discussed in the previous paragraphs, the AND gate 28 includes a pair of molecular rectifying wires and each rectifying wire 12 having their sections 15 chemically bonded together, carrying one or more electron donating groups 18 and electron accepting groups 17, 17', as shown in FIG. 10A. The insulating group 31 is connected to the connecting node 30 via the polyphenylene conducting wire 32, and the polyphenylene conducting wire 34 extends from the connecting node 30 to the "carry" output terminal C. The XOR gate 45 includes a pair of molecular rectifying wires 12, the sections 14 being chemically bonded together and each rectifying wire carrying one or more electron accepting groups 17 and one or more electron donor groups 18. The insulating chain 48 is connected to one terminal of the RTD 47, while another side of the RTD 47 is connected to the connecting node 46. The input terminal 35 of the AND gate 28 is bonded to the input terminal 53 of the XOR gate, while the input terminal 36 of the AND gate is bonded to the input terminal 52 of the XOR gate through respective polyphenylene-based wires. Therefore, both AND gate 28 and XOR gate 45 have common input terminals A and B. The output terminal 51 of the XOR gate 45 defines the "Sum" output Terminal S of HALF ADDER 54, the truth table for which is shown in FIG. 13C. The output terminal 37 of the AND gate 28 defines the "Carry" output terminal C of the HALF ADDER 54, the truth table for which is shown in FIG. 13D.

Figure 14A:
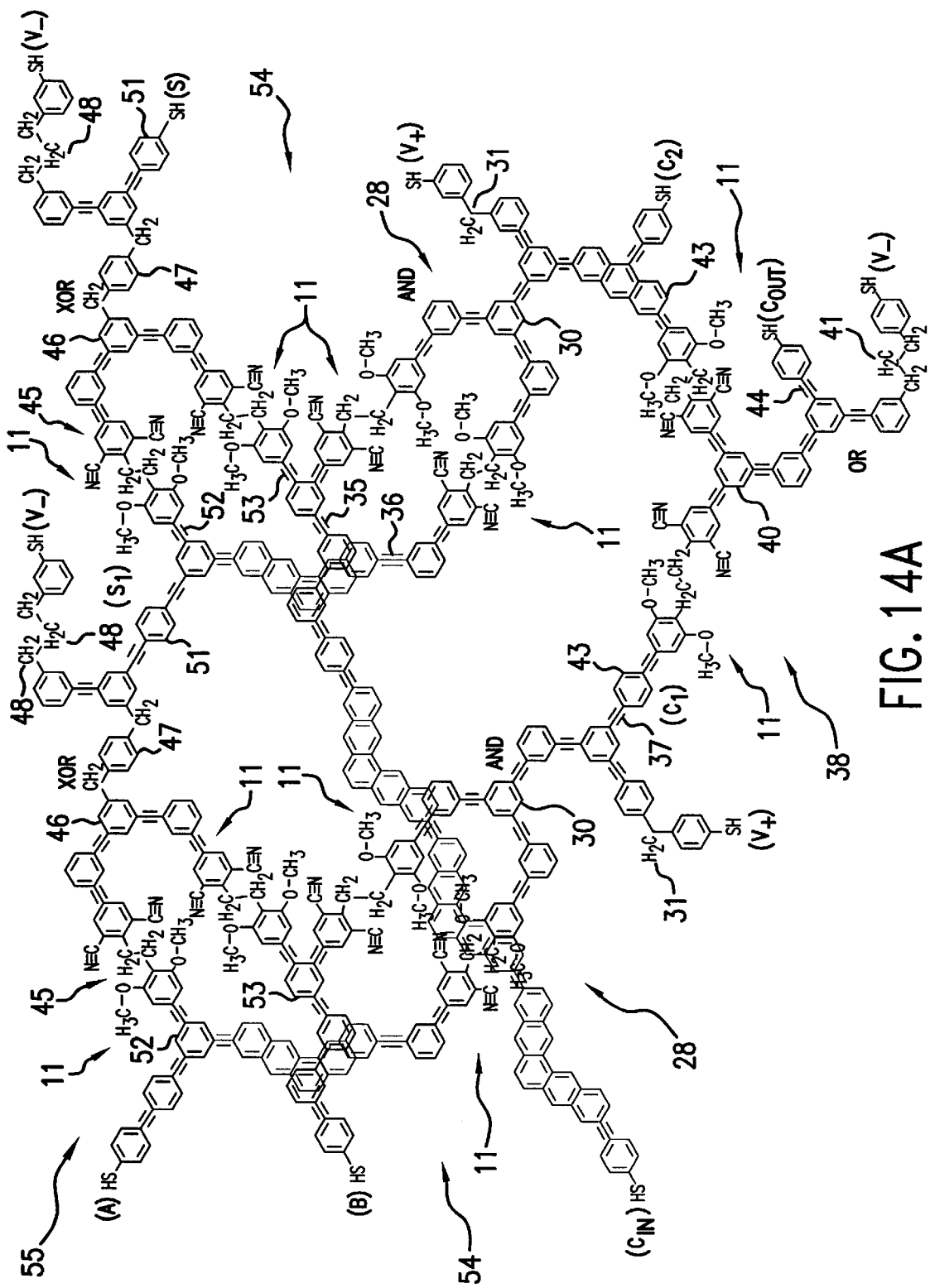
FIG. 14A is an exemplary schematic representation of the molecular structure for a FULL ADDER of the present invention.
Figures 14B, 14C:
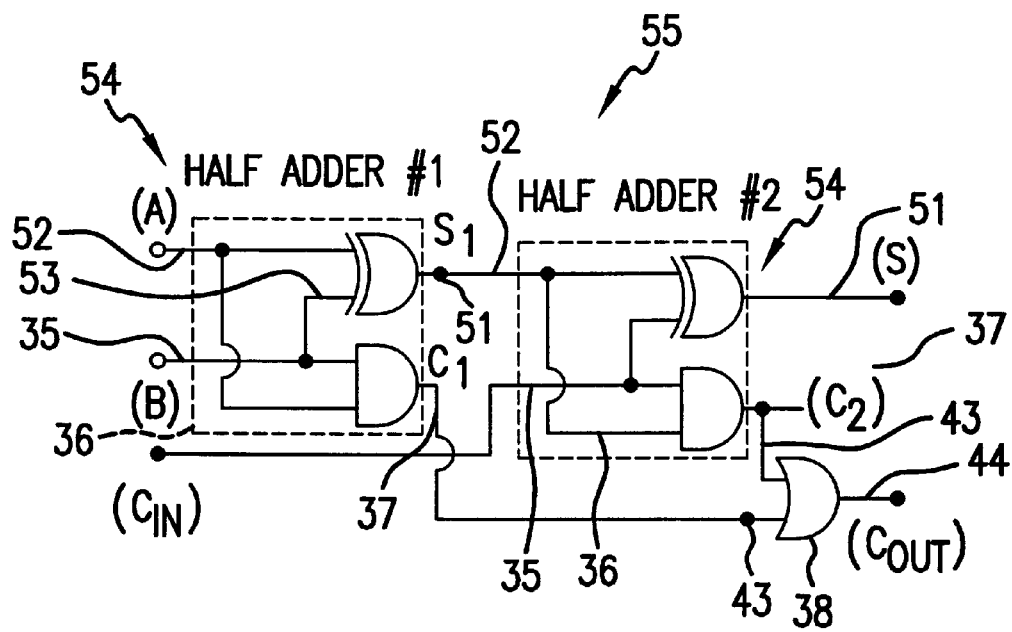
FIG. 14B is a LOGIC diagram for a FULL ADDER of the present invention.
FIG. 14C is a truth table for the FULL ADDER of the present invention.

It is possible to combine two HALF ADDER molecules 54 and an OR gate molecule 38 to produce a molecular FULL ADDER 55 shown in FIGS. 14A–14B. This FULL ADDER molecule has dimensions approximating 25 nm×25 nm. The schematic logic diagram of a FULL ADDER includes in FIG. 14B two HALF ADDERS 54 that are connected, so that the SUM outputs of HALF ADDER #1 is coupled to the first input of the XOR gate in the HALF ADDER #2. The carry output C of HALF ADDER #1 is coupled to the second input terminal of OR gate 38, so that the three input terminals (A, B, and $C_{IN}$) of FULL ADDER 55 are the input terminals 52 and 35 of HALF ADDER #1 and the second input terminal 35 of HALF ADDER #2. The output terminals of the FULL ADDER 55 are outputs 51 and 44, corresponding to the SUM output S and the CARRY output $C_{OUT}$.

The molecular implementation of the FULL ADDER 55 is shown in FIG. 14A. As can be seen, the single molecule FULL ADDER 55 comprises a pair of sequentially chemically bonded molecular HALF ADDERS 54 and a molecular OR gate 38 chemically bonded to the molecular combination of HALF ADDERS 54. Each molecular HALF ADDER 54 includes a molecular AND gate 28 chemically bonded to a XOR gate 45 as previously disclosed.

Unlike macro-scale structures where conductors of infinitely variable length can interconnect devices, molecular scale structures are of sizes that are fixed and invariant. In order for the monomolecular logic gates to "fit" together to form more complex monomolecular circuits, some chains must be adjusted in effective length, as by rotation out of the plane of a major portion of the resulting molecular, and adjusting bond lengths by the substituent selected, or selecting ring bonding sites to angle a "chain portion" in a predetermined direction. The molecular structure thus achieved must have the proper topology and conductivity to achieve the particular logic function in a single molecule, as would be obtained if macro-scale gates were "wired" together.

As previously discussed, the instant invention provides a rectifying diode embedded in a molecular conducting wire. Such a "rectifying wire" is formed by inserting a saturated aliphatic bridging group, or a group having a aliphatic character with respect to electron transport, into the conductive "chain" of the wire and doping each of the sections of the chain on "opposite sides" of the saturated aliphatic insulator to define at least one electron donor site and at least one electron acceptor site. Even though diode-based circuits do not provide the gain required for extended logic structure, it is likely that they will be used extensively in combination with transistors which can provide gain. This is because diode-based circuits require many fewer interconnections. Fewer interconnections is an important factor in the design and fabrication of ultra-dense molecular electronic circuits. Molecular electronic circuits that incorporate molecular diode-based circuits are chemically producible in vast quantities.

The newer emerging fabrication technology of mechanosynthesis with nanoprobes and chemosynthesis can be used for fabrication of the molecular structures disclosed herein. Mechanosynthesis is fabrication conducted atom by atom or molecule by molecule, using small mechanical system— e.g., nanoprobes—to control chemical reactions at specific sites of a molecule. Nanoprobes, such as scanning tunneling microscopes (STM), for manipulating and imaging matter on the molecular and atomic scale are usable and are being miniaturized and refined to an incredible degree. Miniaturized STMs now can be shrunk to a few tenths of microns and thereby capable of manipulating a 1–2 microns molecule. By contrast, chemosynthesis takes advantages of the driving force and speed of bulk chemical processes to make nanometer scale structures. Structures of the present invention manufactured by this method would have an advantage of being produced in great quantity.

The mechanosynthetic or molecular engineering route proposes using atomic or molecular manipulators to assemble devices by positioning their atoms or molecules in the correct places one at a time or several at a time. An STM employs a very sharp tip on the end of a metal foil cantilever several centimeters in length, through which a few tenths of a volt pass to a conducting sample. An STM can detect or "see" atoms when the tip is in close proximity, approximately 0.5 nm, to the surface of the sample because a current is created by low energy electrons tunneling between the tip and atom in the sample. This tunneling current changes by an order of magnitude for every 0.1 nm that the gap between the tip and the sample changes. This sensitivity translates to high accuracy and precision when observing features on the surface of a nanometer-scale sample.

To move an atom under the tip of an STM, the tip voltage can be increased from an observation voltage of approximately 0.1 volts to a "sliding" voltage of approximately 1 volt, provided that the atom has little affinity for the surface. If the atom or molecule to be moved is covalently bonded to the surface, the STM could break it loose. The ability to manipulate matter on the atomic scale permits creation of nanometer scale structures.

Fabrication of the disclosed molecular structures can be made by use of an atomic force microscope (AFM), which monitors deflection of a cantilever as it rides along a sample's surface instead of monitoring an electric current between the tip and sample. While the AFM doesn't offer the dexterity of an STM nor the ability to coax atoms to jump, it does, however, provides a unique means of "pushing" atoms and molecules around a surface regardless of their conductivity.

Chemosynthesis is another fabrication method for fabrication of the components for nanometer scale structures. For instance, one form of chemosynthesis, chemical self-assembly, is the spontaneous orientation of a number of molecules into an energetically favored supramolecular structure without human intervention. This most often occurs through non-covalent bonding among molecules. Information about the supramolecular structure is encoded in the molecular components through their shape, functional groups, etc. Self-assembling molecules require weak interactions among constituents molecular sub-units to produce stability. This weak interaction includes hydrogen bonding, electrostatic interaction, and Van der Waal's forces. The important advantage of chemical self-assembly over other methods of nanometer-scale fabrication is the error correction process inherent in the self-assembly of chemical nanostructures. As a self-assembling chemical system attempts to reach a thermodynamically stable state, it can tend to rid the growing structure of any molecules of the wrong type or in the wrong position that are caught in the assembly process. This can permit self-assembly processes to create very many identical copies of nanometer scale structures that are particularly stable and sturdy. Parallel processes for the fabrication of nanostructures also are possible because of the extremely large number of identical molecular initiation points for self-assembly that are found in typical solutions. This is significant because the fabrication of many nanostructures in parallel seems imperative for the efficient production of future ultra-dense computer designs that are projected to consist of trillions of individual components. Nanoprobes could then used to isolate each of the individual single molecule circuit components, logic gates or logic junctions being synthesized.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described. Certain features may be used independently of other features, and in certain cases, particular location of elements may be reversed or interposed, all without departing from the spirit or scope of the invention as defined in the appended Claims.

What is claimed is:

1. A monomolecular electronic device, comprising:
   at least one molecular conducting wire having a plurality of joined substantially identical aromatic ring structures;
   an insulating group bonded between a respective pair of said aromatic ring structures to establish two sections of said molecular conducting wire; and,
   means for doping each of said first and second sections to form a respective electron donor site and an electron acceptor site, and thereby integrally forming a rectifying diode in said molecular conducting wire.

2. The monomolecular electronic device as recited in claim 1 where said first section is chemically doped by at least one electron donating group bonded thereto, and said second section is chemically doped by at least one electron accepting group bonded thereto.

3. The monomolecular electronic device as recited in claim 2 wherein said electron donating group is selected from the set consisting of $-NH_2$, $-OH$, $-CH_3$, $-CH_2CH_3$.

4. The monomolecular electronic device as recited in claim 2 where said electron accepting group is selected from the group consisting of $-NO_2$, $-CN$, $-CHO$, $-COR'$, wherein R' includes an aliphatic chain.

5. The monomolecular electronic device as recited in claim 1 where said insulating group is selected from the set consisting of a saturated aliphatic bridging group, or groups having a predominant aliphatic character with respect to electron transport.

6. The monomolecular electronic device as recited in claim 5 where said saturated aliphatic bridging group is selected from the set consisting of a methylene group $-CH_2-$, a sigma-bonded ethylene group $-CH_2CH_2-$, and longer chains thereof.

7. The monomolecular electronic device as recited in claim 1 where said molecular conducting wire includes a plurality of ethylene spacers respectively disposed between said aromatic ring structures for linking one aromatic ring structure to an adjacent other.

8. The monomolecular electronic device as recited in claim 1 where said molecular conducting wire is a polyphenylene-based molecular conducting wire.

9. The monomolecular electronic device as recited in claim 1 further comprising means for enhancing conductivity between respective ends of said molecular conducting wire and a metal contact.

10. The monomolecular electronic device a recited in claim 5, further comprising:
    a plurality of molecular conducting wires having respective first and second sections, each of said plurality of molecular conducting wires having said rectifying diode-embedded therein, respective ones of said first and said second sections of each of said plurality of rectifying diode embedded molecular conducting wires being joined to a connecting node defined by an aromatic ring;
    an output lead defined by a plurality of joined aromatic rings joined to said connecting node; and,
    a resistive lead joined to said connecting node for coupling a power supply reference potential thereto, said resistive lead having a plurality of joined aromatic rings with at least one pair of aromatic rings being joined by a selected one of said insulating groups, thereby forming a Boolean logic function.

11. The monomolecular electronic device as recited in claim 10 where said Boolean logic function is selected from the group consisting of an OR gate, an AND gate, an XOR gate, a HALF ADDER, a FULL ADDER, and combinations thereof.

12. A monomolecular electronic rectifying device, comprising:
   a polyphenylene-based conducting wire having a plurality of joined molecular ring structure;
   an insulating group bonded between a respective pair of said molecular ring structures to establish two sections of said conducting wire;
   a first dopant group bonded to said first section to form a respective electron donor site; and,
   a second dopant group bonded to said second section to form an electron acceptor site, and thereby integrally forming a rectifying diode in said conducting wire.

13. The monomolecular electronic rectifying device as recited in claim 12 where said first dopant group is selected from the set consisting of —NH$_2$, —OH, —CH$_3$, —CH$_2$CH$_3$.

14. The monomolecular electronic rectifying device as recited in claim 13 where said second dopant group is selected from the set consisting of —NO$_2$, —CN, —CHO, —COR', wherein R' includes an aliphatic chain.

15. The monomolecular electronic rectifying device a recited in claim 12 where said insulating group is selected from the set consisting of a saturated aliphatic bridging group, or groups having a predominant aliphatic character with respect to electron transport.

16. A rectifying diode integrated into a molecular conducting wire having the formula:

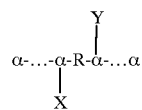

wherein α is a ring of an aromatic group, R is a member of a saturated aliphatic group, X is at least one substituent that is a member of an electron donor group and Y is at least one substituent that is a member of an electron acceptor group.

17. The rectifying diode integrated into a molecular conducting wire as recited in claim 16 where said ring is selected from the group consisting of benzine, cyclopentadiene, cyclopropene, and combinations thereof.

18. The rectifying diode integrated into a molecular conducting wire as recited in claim 16 further defined by a dimethyl-dicyano polyphenylene-based molecule of the formula

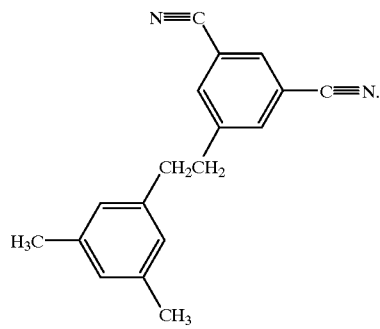

19. The rectifying diode integrated into a molecular conducting wire as recited in claim 16 further defined by a dimethoxy-dicyano polyphenylene-based molecule of the formula

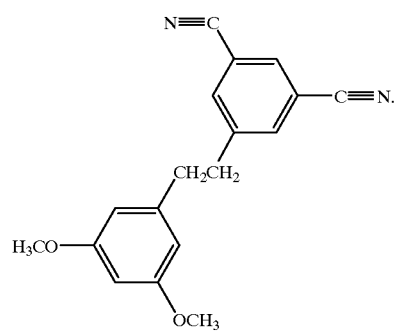

20. An AND gate integrated into a molecular conducting wire having the formula:

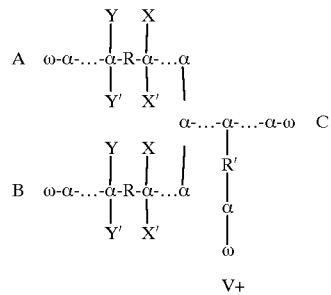

wherein α is a ring of an aromatic group, R and R' are saturated aliphatic groups, X and X' are electron donor groups, Y and Y' are electron acceptor groups and ω is a substituent that binds chemically to an electrical contact.

21. The AND gate as recited in claim 20 further defined by a molecule having the formula

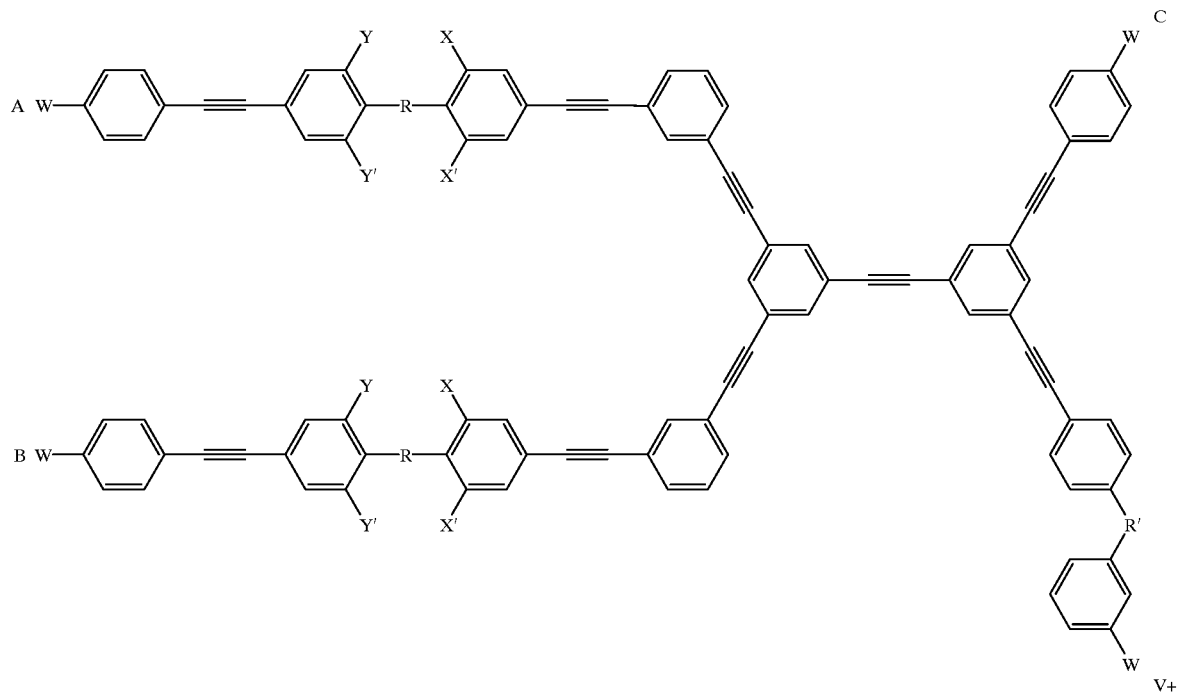

wherein A and B are inputs, C is an output, V+ is a reference voltage, R and R' are saturated aliphatic groups, X and X' are electron donor groups, Y and Y' are electron acceptor groups and ω is a substituent that binds chemically to an electrical contact.

22. An OR gate integrated into a molecular conducting wire having the formula:

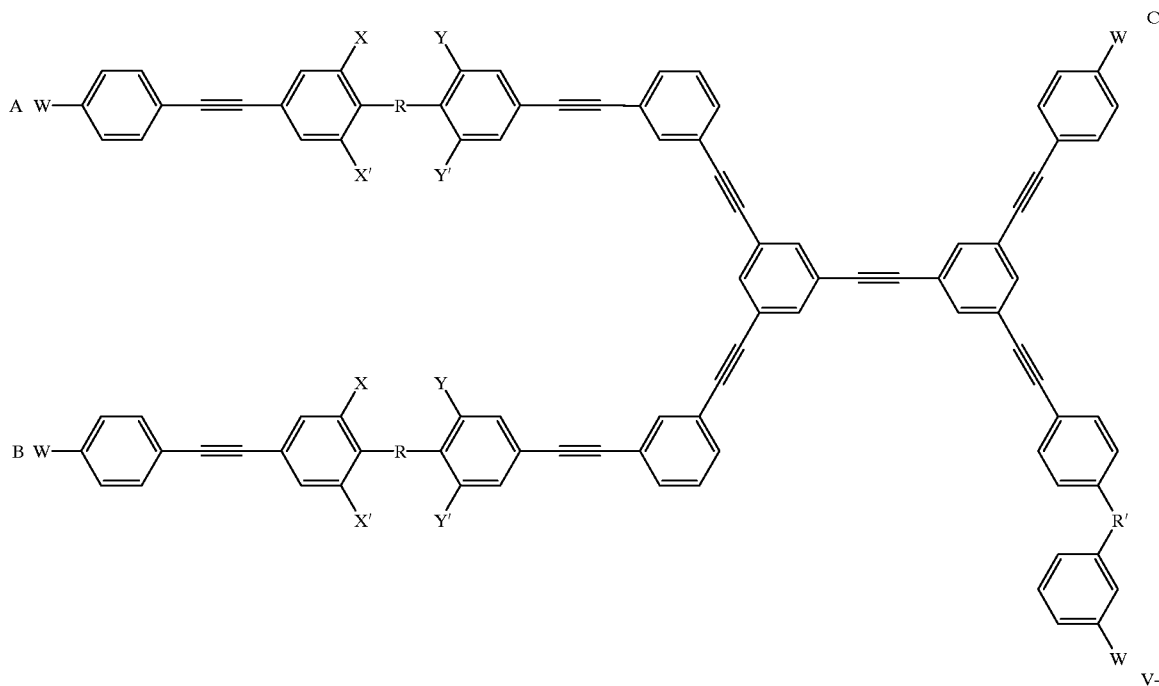

wherein A and B are inputs, C is an output, V− is a reference voltage, ω is a substituent that binds chemically to an electrical contact, R and R' are saturated aliphatic groups, X and X' are electron donor groups, and Y and Y' are electron acceptor groups.

23. An XOR gate integrated into a molecular conducting wire having the formula aliphatic groups, X and X' are electron donor groups, and Y and Y' are electron acceptor groups.

24. A HALF ADDER integrated into a molecular conducting wire having the formula

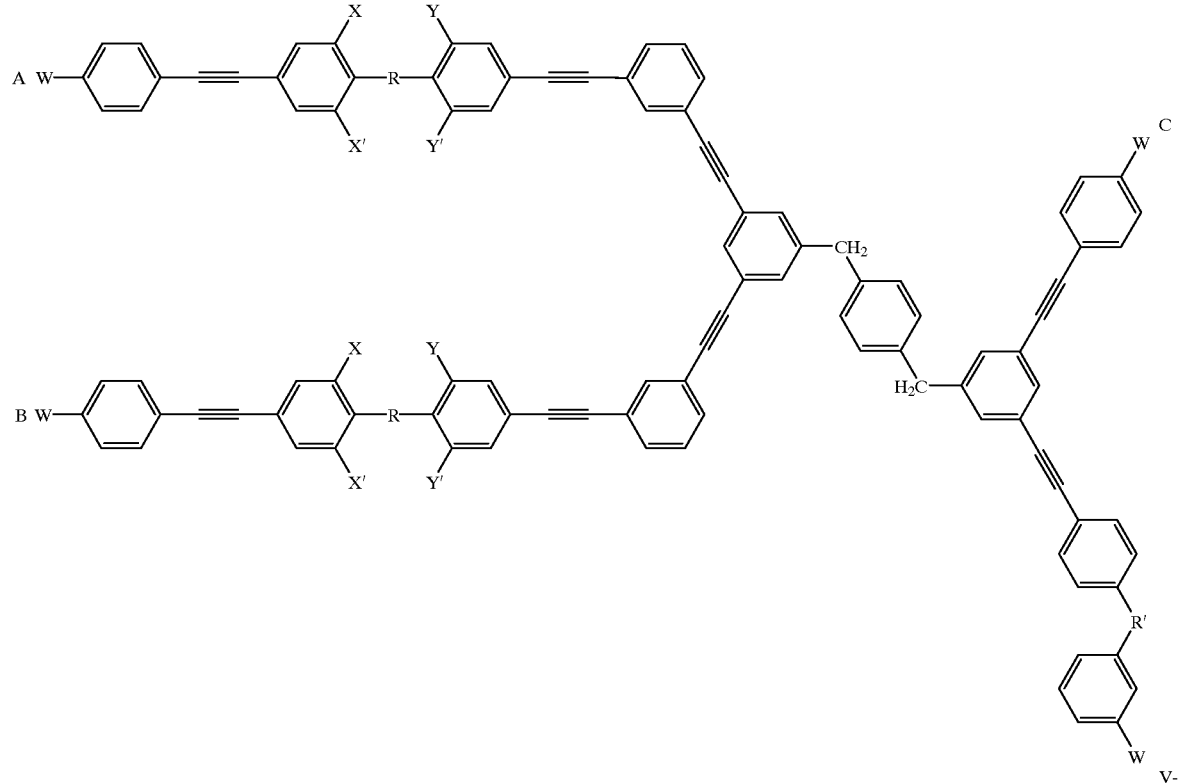

wherein A and B are inputs, C is an output, V− is a reference voltage, ω is a substituent that binds chemically to an electrical contact, R and R' are saturated

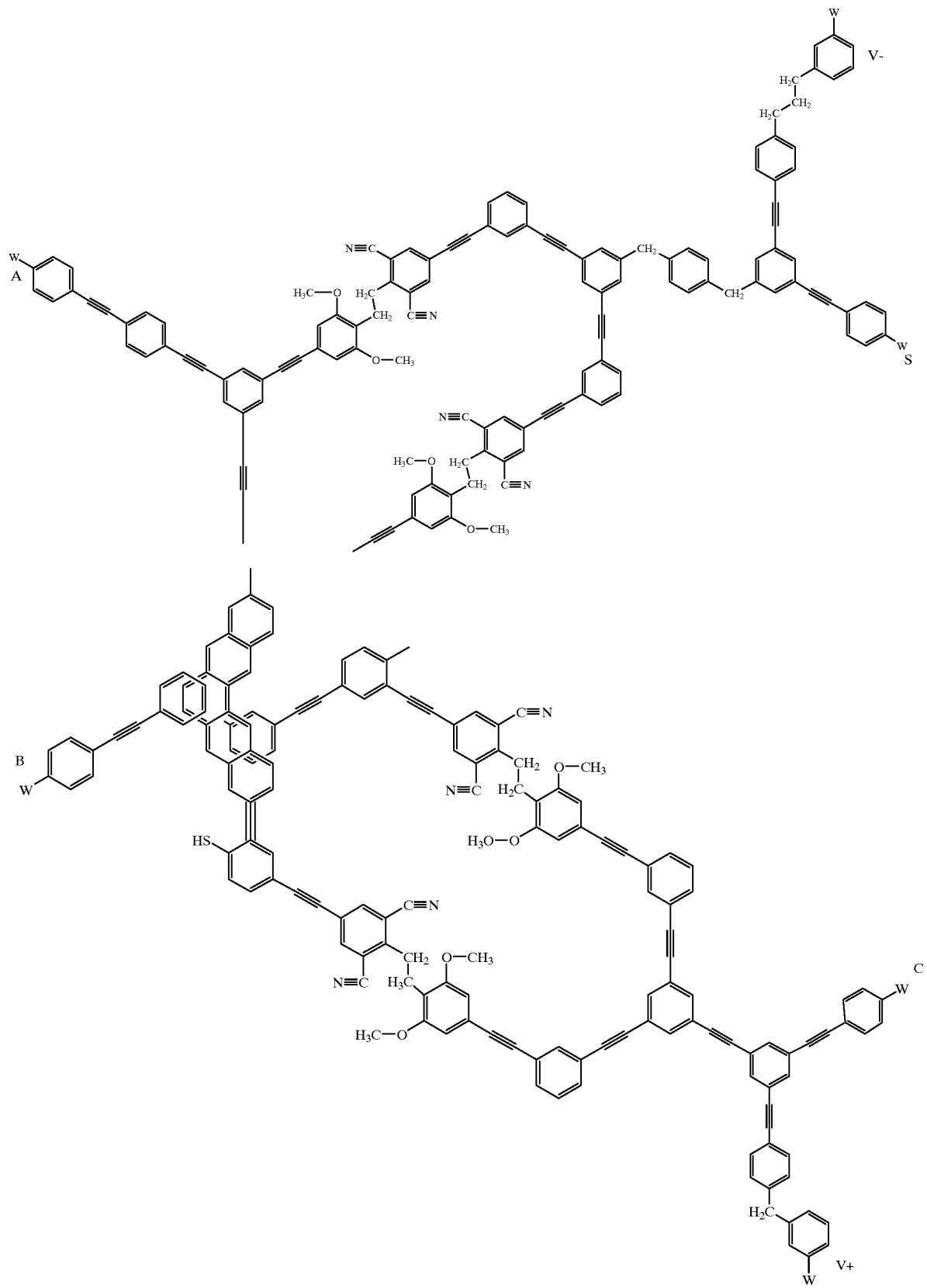

wherein A and B are inputs, S is a SUM output, C is a CARRY output, V+ and V− are reference voltages, and ω is a substituent that binds chemically to an electrical contact.

25. A FULL ADDER integrated into a molecular conducting wire having the formula:

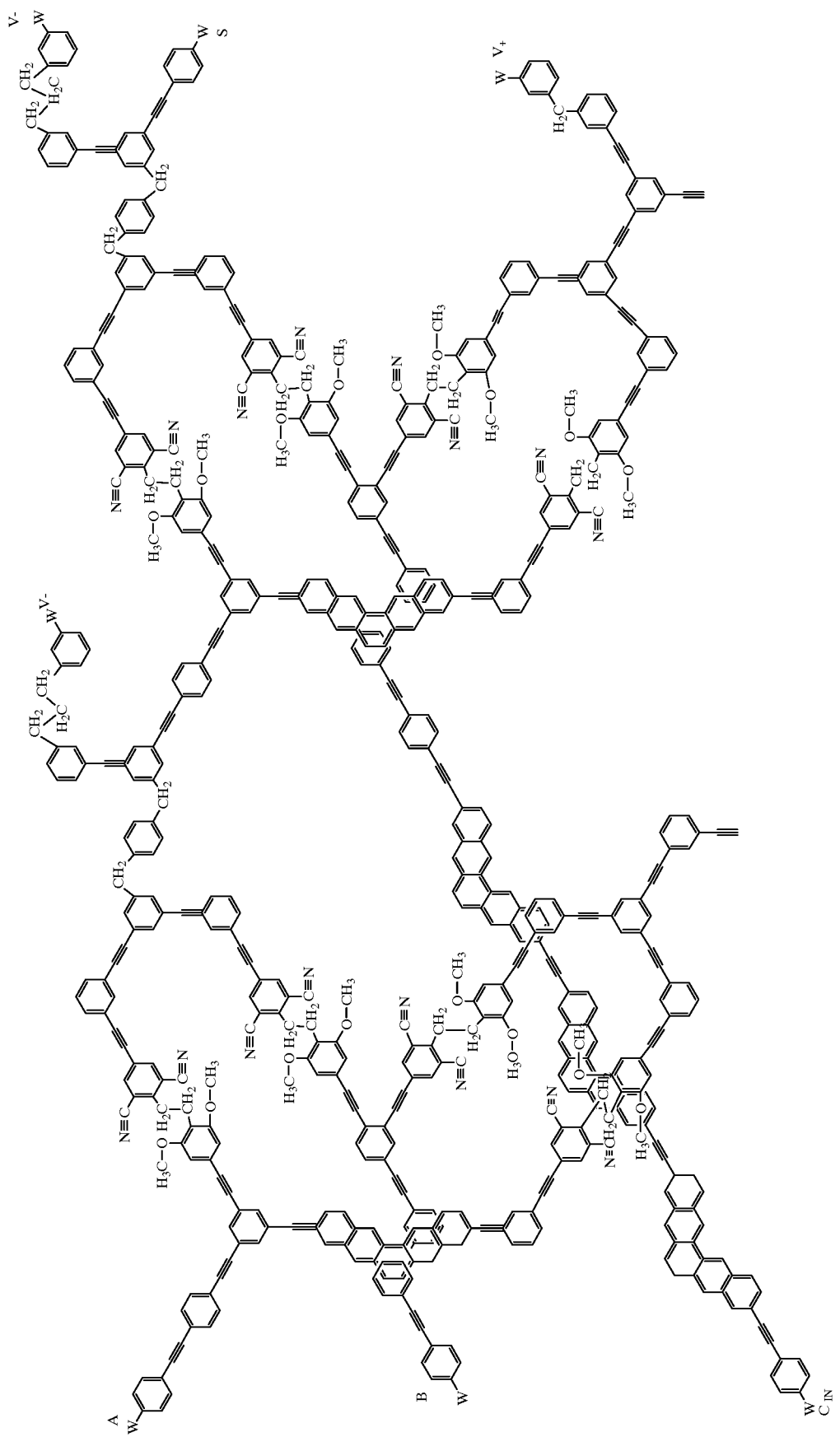

-continued
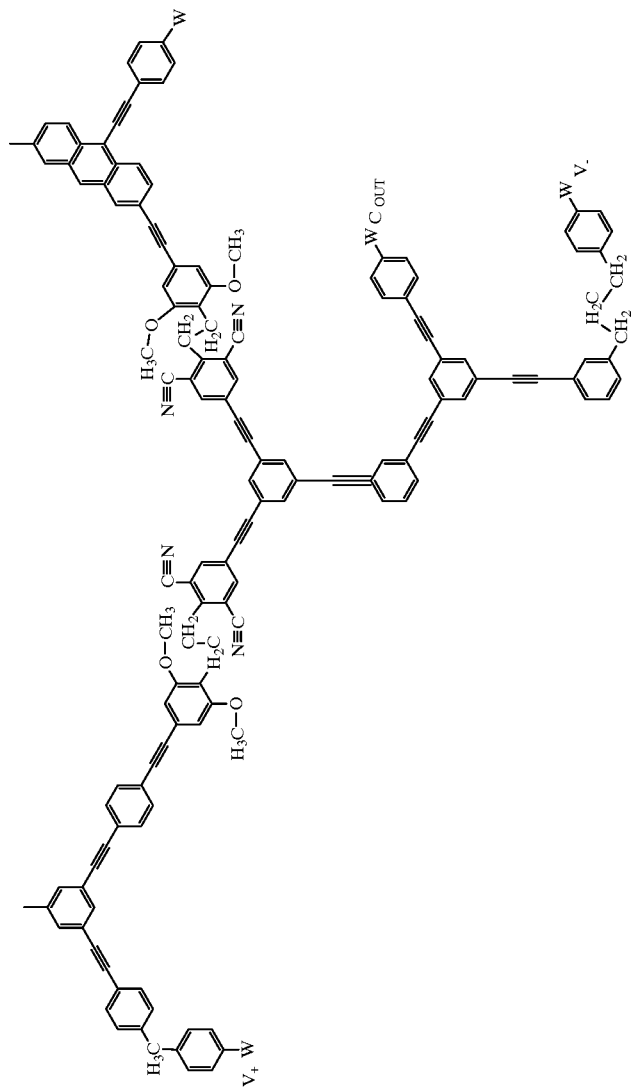

wherein A and B are inputs, S is a SUM output, $C_{in}$ is a CARRY input, $C_{out}$ is a CARRY output, V+ and V− are reference voltages, and ω is a substituent that binds chemically to an electrical contact.

26. A monomolecular logic structure, comprising:
a first molecular conducting wire having a rectifying diode imbedded therein, said first molecular conducting wire having an end for receiving a first input signal current;
at least a second molecular conducting wire having a rectifying diode imbedded therein, said second molecular conducting wire having an end for receiving a second input signal current;
at least one node defined by an aromatic ring chemically bonded to a respective portion of both said first and second molecular conducting wires;
an output molecular branch joined to said node, said output molecular branch being formed by at least one aromatic ring; and,
a resistive molecular branch joined to said node for applying an electric potential thereto and thereby define a single molecule for combining said first and second input signal currents in accordance with a predetermined Boolean logic function.

27. The monomolecular logic structure as recited in claim 26 where said predetermined Boolean logic function is selected from the group consisting of an AND gate, an OR gate, an XOR gate, a HALF ADDER, a FULL ADDER, and combinations thereof.

28. A monomolecular logic structure comprising a plurality of molecular conducting wires chemically joined together to form a single molecule having a predetermined structure defining a predetermined Boolean logic function, a selected portion of said plurality of molecular conducting wires each being chemically doped to form a current carrying rectifying diode therein.

29. The monomolecular logic structure as recited in claim 28 where said predetermined Boolean logic function is selected from the group consisting of an AND gate, an OR gate, an XOR gate, a HALF ADDER, a FULL ADDER, and combinations thereof.

30. The monomolecular logic structure as recited in claim 28 where said single molecule is a polyaromatic molecule.

31. The monomolecular logic structure as recited in claim 30 where said polyaromatic molecule has a plurality of molecular rings selected from the group consisting of phenylene, cyclopentadiene, cyclopropene, and combinations thereof.

32. A monomolecular logic structure comprising a plurality of molecular rectifying and conducting wires chemically joined together to form a single molecule having a predetermined structure defining a predetermined Boolean logic function.

33. The monomolecular logic structure as recited in claim 32 where said predetermined Boolean logic function is selected from the group consisting of an AND gate, an OR gate, an XOR gate, a HALF ADDER, a FULL ADDER and combinations thereof.

34. A monomolecular logic structure comprising a combination of monomolecular logic gates to form a predetermined Boolean function, said monomolecular logic gates having chain lengths, bond lengths, ring bonding site location and rotation selected to form a predetermined topology and conductivity that implements said predetermined Boolean function.

* * * * *